US012446397B2

(12) United States Patent
Shin et al.

(10) Patent No.: US 12,446,397 B2
(45) Date of Patent: Oct. 14, 2025

(54) DISPLAY PANEL INCLUDING CONDUCTIVE SIDE COVER

(71) Applicant: LG DISPLAY CO., LTD., Seoul (KR)

(72) Inventors: Myeongah Shin, Paju-si (KR); Junjae Lee, Paju-si (KR)

(73) Assignee: LG Display Co., Ltd., Seoul (KR)

(*) Notice: Subject to any disclaimer, the term of this patent is extended or adjusted under 35 U.S.C. 154(b) by 461 days.

(21) Appl. No.: 18/087,040

(22) Filed: Dec. 22, 2022

(65) Prior Publication Data
US 2023/0200127 A1 Jun. 22, 2023

(30) Foreign Application Priority Data

Dec. 22, 2021 (KR) .................. 10-2021-0184904

(51) Int. Cl.
*H10K 50/86* (2023.01)
*H10K 50/80* (2023.01)
*H10K 50/844* (2023.01)
*H10K 50/87* (2023.01)
*G02F 1/1333* (2006.01)
*H10K 50/842* (2023.01)

(52) U.S. Cl.
CPC ......... *H10K 50/868* (2023.02); *H10K 50/844* (2023.02); *H10K 50/87* (2023.02); *G02F 1/133331* (2021.01); *H10K 50/8426* (2023.02)

(58) Field of Classification Search
CPC .... H10K 50/868; H10K 50/844; H10K 50/87; H10K 50/841; H10K 50/865; H10K 50/8426; H10K 59/871; H10K 59/8794; H10K 77/111; H10K 9/0067; G02F 1/136204; G02F 1/133331; G09F 9/30
See application file for complete search history.

(56) References Cited

U.S. PATENT DOCUMENTS

| 11,112,629 | B2* | 9/2021 | Kim | .................. G02F 1/133308 |
| 2020/0152907 | A1 | 5/2020 | Oh et al. | |
| 2021/0126223 | A1* | 4/2021 | Choi | .................... H10K 77/111 |

FOREIGN PATENT DOCUMENTS

| CN | 105808012 A | * | 7/2016 | .......... G06F 3/0412 |
| KR | 10-2013-0088534 A | | 8/2013 | |
| KR | 10-2018-0049411 A | | 5/2018 | |
| KR | 20180067051 A | * | 6/2018 | ......... G02F 1/13338 |
| KR | 10-2018-0079044 A | | 7/2018 | |
| KR | 10-2020-0053133 A | | 5/2020 | |
| KR | 10-2021-0085826 A | | 7/2021 | |
| KR | 20210081953 A | * | 7/2021 | ............. G09F 9/301 |

(Continued)

OTHER PUBLICATIONS

Office Action dated May 23, 2025 issued in corresponding Korean Patent Application No. 10-2021-0184904.

*Primary Examiner* — Ida M Soward
(74) *Attorney, Agent, or Firm* — Morgan, Lewis & Bockius LLP

(57) ABSTRACT

A display panel includes a cover window; an adhesion layer below the cover window; a polarizing plate below the adhesion layer; a panel layer below the polarizing plate; a support member below the panel layer; and a conductive side cover attached to a side surface of the polarizing plate and to a lower surface of the support member, wherein at least one of the cover window, the adhesion layer, and the polarizing plate includes an electrically conductive material to have increased electrical conductivity.

24 Claims, 13 Drawing Sheets

(56) References Cited

FOREIGN PATENT DOCUMENTS

| KR | 20210086002 A | * | 7/2021 | ......... H10K 59/8794 |
| KR | 20210086029 A | * | 7/2021 | ............. G09F 9/301 |
| WO | WO-2015192531 A1 | * | 12/2015 | ........... G06F 3/0412 |

* cited by examiner

DISPLAY PANEL INCLUDING CONDUCTIVE SIDE COVER

CROSS-REFERENCE TO RELATED APPLICATIONS

The present application claims priority to Korean Patent Application No. 10-2021-0184904, filed Dec. 22, 2022, the entire contents of which are incorporated herein for all purposes by this reference.

BACKGROUND

Technical Field

The present disclosure relates to a display panel, and more particularly, to a display panel that can prevent an electric charge generated on an upper portion of a cover window from penetrating into the display panel by treating a component on a panel layer to have increased conductivity, thereby preventing a greenish phenomenon.

Discussion of the Related Art

A liquid crystal display device, a field emission display device, an electrowetting display device, an organic light emitting display device, and the like are commonly used as display devices. Such a display device may include a cover window of glass or plastic to protect a display panel therein from external impacts. However, there is a problem in that an electric charge generated by friction between the cover window and an external object or an electric charge generated externally may accumulate on the cover window. In addition, the accumulated electric charge may move from a side surface of the display panel to a panel layer in the display panel, which may cause a so-called shift phenomenon in that a threshold voltage value of a driving thin film transistor in the display layer is shifted.

When the threshold voltage value of the driving thin film transistor is increased due to occurrence of the shift phenomenon, the display panel emits light at a voltage higher than before, thereby causing a greenish phenomenon in that an end portion or side area of the display panel emits light more brightly than the other areas. Thus, the quality of the displayed image may be lowered. On the other hand, when the threshold voltage value of the driving thin film transistor is decreased due to occurrence of the shift phenomenon, the display panel emits light even at a signal having a lower value than the light-emitting signal, thereby causing a greenish phenomenon emitting light more brightly than the other areas. Thus, the quality of the displayed image may be lowered.

SUMMARY

Accordingly, embodiments of the present disclosure are directed to a display panel that substantially obviates one or more of the problems due to limitations and disadvantages of the related art.

An aspect of the present disclosure is to prevent an electric charge generated on a surface of a cover window of a display panel due to friction from penetrating into the display panel, thereby preventing the greenish phenomenon.

To achieve these and other aspects of the inventive concepts, as embodied and broadly described herein, a display panel may comprise a cover window; an adhesion layer below the cover window; a polarizing plate below the adhesion layer; a panel layer below the polarizing plate; a support member below the panel layer; and a conductive side cover attached to a side surface of the polarizing plate and to a lower surface of the support member, wherein at least one of the cover window, the adhesion layer, and the polarizing plate includes an electrically conductive material to have increased electrical conductivity.

An electric charge travelling from the cover window into the display panel may move from the at least one treated to have increased conductivity of the cover window, the adhesion layer and the polarizing plate through the side cover to the heat dissipation sheet.

The side cover may be made of a metal.

The metal may be silver (Ag).

The side cover may be covered by a black matrix.

The polarizing plate may include a conductive coating layer disposed thereon.

The side cover may include a fixing portion disposed on the conductive coating layer and protruding inward from the adhesion layer.

The conductive coating layer may include a stepped portion, and the side cover may include a fixing portion protruding inward from the stepped portion.

The adhesion layer may include a conductive particle therein.

The side cover may include a fixing portion disposed on the polarizing plate and protruding inward from the adhesion layer.

The polarizing plate may include a stepped portion, and the side cover may include a fixing portion protruding inward from the stepped portion.

The cover window may include a conductive coating layer disposed therebelow.

The side cover may include an extending portion disposed below the conductive coating layer and protruding outward, and disposed on a side surface of the adhesion layer.

According to the present disclosure, a path may be provided through which an electric charge generated due to friction can be moved to a lower portion of a support member, by treating at least one of a cover window, an adhesion layer, and a polarizing plate disposed on a panel layer to have increased conductivity and by disposing a conductive side cover attached at one end to a side surface of the polarizing plate and at the other end to a lower surface of the support member.

As such, penetration of an electric charge generated due to friction into the panel layer may be prevented. Further, a shift phenomenon of a switching element in the panel layer may be reduced, thereby preventing a greenish phenomenon. Additionally, the side cover may be prevented from peeling off depending on the external environment by providing a fixing portion of the side cover.

It is to be understood that both the foregoing general description and the following detailed description are exemplary and explanatory and are intended to provide further explanation of the inventive concepts as claimed.

BRIEF DESCRIPTION OF THE DRAWINGS

The accompanying drawings, which are included to provide a further understanding of the disclosure and are incorporated in and constitute a part of this application, illustrate embodiments of the disclosure and together with the description serve to explain various principles. In the drawings.

DETAILED DESCRIPTION

Figure 1:
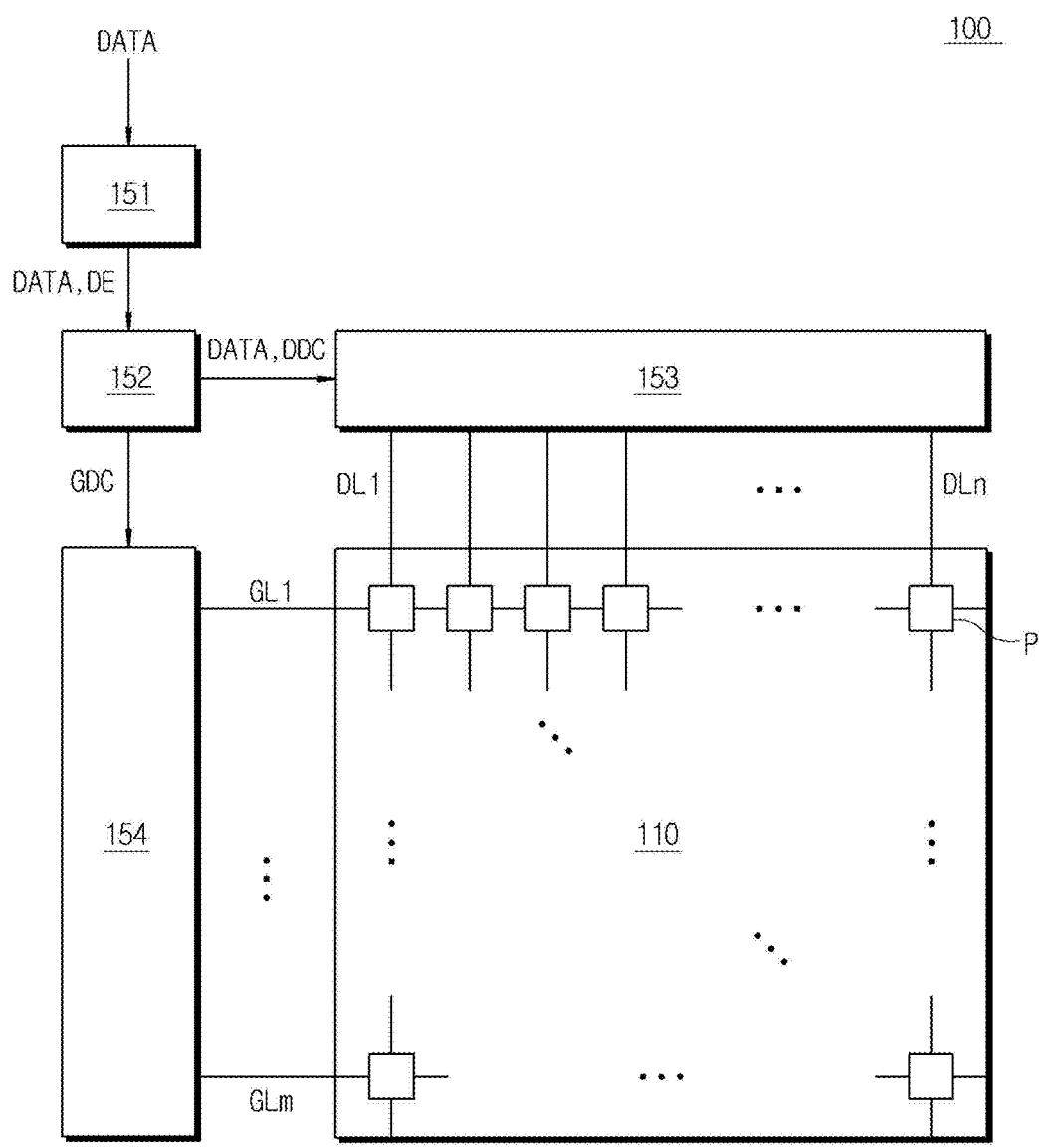
FIG. 1 is a block diagram of a display panel according to an embodiment of the present disclosure.

Embodiments of the present disclosure will be described hereinafter with reference to the accompanying drawings. It will be understood that, in the present disclosure, when an element (such as a region, a layer or a portion, etc.) is referred to as being "on," "connected to," or "coupled to" another element, it may be directly on, connected or coupled to the other element, or one or more intervening elements may be present therebetween.

Like reference numerals are used to denote like elements throughout the present disclosure. Also, in the drawings, the thicknesses, proportions, and dimensions of the elements are exaggerated for effective description of technical features. The term "and/or" includes one or more combinations that can be defined by associated elements.

Although the terms "first," "second," etc. may be used herein to describe various elements, the elements should not be limited by these terms. These terms are only used to distinguish one element from another element. For example, without departing from the present disclosure, "a first element" can be referred to as "a second element," similarly "a second element" can be referred to as "a first element." It is to be understood that the singular forms include plural referents unless the context clearly dictates otherwise.

The terms, such as "below," "lower," "above," "upper" and the like, may be used herein to describe a relationship between element(s) as illustrated in the drawings. It will be understood that the terms are spatially relative and based on the orientation depicted in the drawings.

It will be further understood that the terms, such as "include(s)/including," "comprise(s)/comprising," "have (has)/having" and the like, when used in this disclosure, specify the presence of stated features, integers, steps, operations, elements, components or combinations thereof, but do not preclude the presence or addition of one or more other features, integers, steps, operations, elements, components, or combinations thereof.

In addition, the present disclosure will be exemplarily described based on an organic light emitting display panel for convenience of description. However, the spirit of the present disclosure is not limited to an organic light emitting display panel, and may be equally applied to other types of display panels, for example, a liquid crystal display panel, a mini LED display panel, and the like.

FIG. 1 is a block diagram of a display panel according to an embodiment of the present disclosure.

As shown in FIG. 1, a display panel 100 may include an image processor 151, a timing controller 152, a data driver 153, a gate driver 154 and a panel layer 110.

The image processor 151 may output a data signal DATA and a data enable signal DE that are supplied from the outside. The image processor 151 may output one or more of a vertical synchronization signal, a horizontal synchronization signal, and a clock signal further to the data enable signal DE.

The timing controller 152 may receive, from the image processor 151, the driving signals including the data enable signal DE, the vertical synchronization signal, the horizontal synchronization signal and the clock signal, together with the data signal DATA. The timing controller 152 may output a gate timing control signal GDC for controlling an operation timing of the gate driver 154 and a data timing control signal DDC for controlling an operation timing of the data driver 153, based on the driving signals.

The data driver 153 may sample and latch the data signal DATA in response to the data timing control signal DDC supplied from the timing controller 152, convert the same into a gamma reference voltage and output the converted gamma reference voltage. The data driver 153 may output the data signal DATA through data lines DL1 to DLn.

The gate driver 154 may output a gate signal while shifting a level of the gate voltage in response to the gate timing control signal GDC supplied from the timing controller 152. The gate driver 154 may output the gate signal through gate lines GL1 to GLm.

The display panel 110 may display an image while sub-pixel P emit light in response to the data signal DATA and the gate signal supplied from the data driver 153 and the gate driver 154. A detailed structure of the sub-pixel P will be described in detail with reference to FIGS. 2 to 5.

Figure 2:
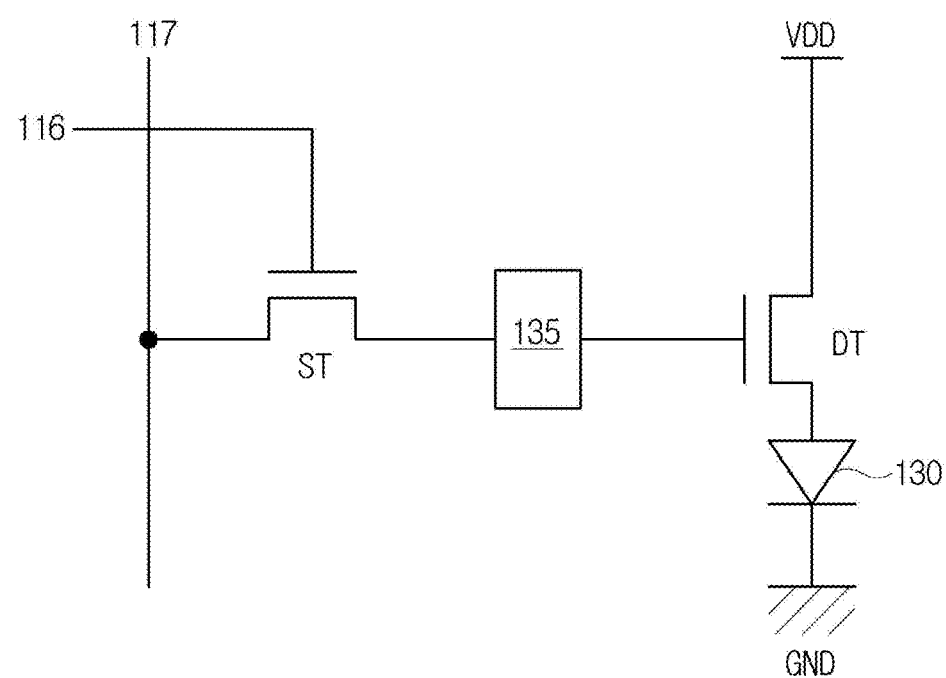
FIG. 2 is a circuit diagram of a sub-pixel included in the display panel according to an embodiment of the present disclosure.

FIG. 2 is a circuit diagram of a sub-pixel included in the display panel according to an embodiment of the present disclosure. As illustrated in FIG. 2, the sub-pixel included in the display panel 100 may include a switching transistor ST, a driving transistor DT, a compensation circuit 135, and a light emitting element 130.

The light emitting element 130 may operate to emit light according to a driving current formed by the driving transistor DT. The switching transistor ST may perform a switching operation such that a data signal supplied through a data line 117 is stored in a capacitor as a data voltage in response to a gate signal supplied through a gate line 116. The driving transistor DT may operate so that a constant driving current flows between a high potential power line VDD and a low potential power line GND in response to a data voltage stored in the capacitor.

The compensation circuit 135 is a circuit for compensating for a threshold voltage or the like of the driving transistor DT, and the compensation circuit 135 may include one or more thin film transistors and capacitors. A configuration of the compensation circuit 135 may vary according to a compensating method. For example, the sub-pixel illustrated in FIG. 2 is configured to have a 2T (transistor) 1C (capacitor) structure including a switching transistor ST, a driving transistor DT, a capacitor, and a light emitting element 130, but when the compensation circuit 135 is added thereto, the sub-pixel may be formed in various structures such as 3T 1C, 4T 2C, 5T 2C, 6T 1C, 6T, 2C, 7T 1C, 7T 2C, and the like.

Figure 3:
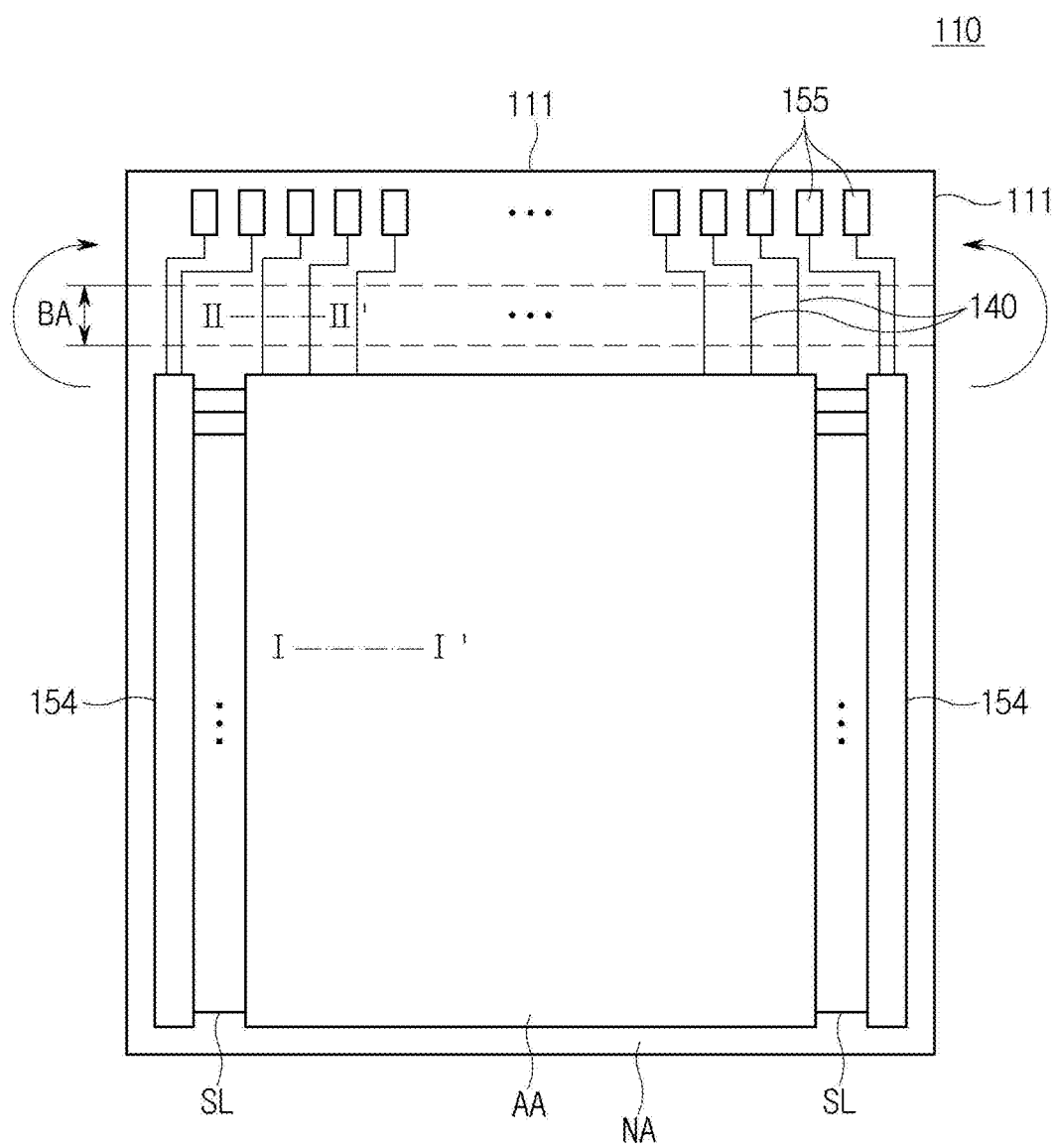
FIG. 3 is a plan view of the display panel according to an embodiment of the present disclosure.

FIG. 3 is a plan view of the display panel according to an embodiment of the present disclosure. FIG. 3 illustrates a state in which a panel layer of the display panel 100 is not bent as an example.

As illustrated in FIG. 3, the panel layer 110 may include a display area AA in which a pixel actually emitting light through a thin film transistor and a light emitting element is disposed on a flexible substrate 111 and a non-display area NA that is a bezel area surrounding an edge of the display area AA.

In the non-display area NA of the flexible substrate 111, a circuit such as a gate driver 154 for driving the panel layer 110 and various signal wiring lines such as a scan line SL may be disposed. The circuit for driving the panel layer 110 may be disposed on the flexible substrate 111 in a manner of gate in panel (GIP) or connected to the flexible substrate 111 in a manner of tape carrier package (TCP) or chip on film (COF).

The non-display area NA may have a bending area BA at one side of thereof. The bending area BA may refer to an area at which the flexible substrate 111 is bent in a direction indicated by the arrow.

The non-display area NA of the flexible substrate 111 is an area in which a wiring line and a driving circuit for driving a screen are disposed. Since the non-display area NA is not an area where an image is displayed, the non-display area does not need to be visibly recognized from a top surface of the flexible substrate 111. Accordingly, by bending a portion of the non-display area NA of the flexible substrate 111, the bezel may be reduced while securing an area for the wiring lines and the driving circuit.

Various wiring lines may be formed on the flexible substrate 111. The wiring lines may be formed in the display area AA of the flexible substrate 111, or may be formed in the non-display area NA as well. Circuit wiring lines 140 may be formed of a conductive material and may be formed of a conductive material having an excellent ductility in order to prevent occurrence of cracks when bending the flexible substrate 111. The circuit wiring lines 140 may be formed of a conductive material having an excellent ductility such as gold (Au), silver (Ag), aluminum (Al) or the like. The circuit wiring lines 140 may also be formed of molybdenum (Mo), chromium (Cr), titanium (Ti), nickel (Ni), neodymium (Nd), copper (Cu), or an alloy of silver (Ag) and magnesium (Mg). The circuit wiring lines 140 may be formed to have a multi-layered structure including various conductive materials, for example, in a triple layered structure of titanium (Ti)/aluminum (Al)/titanium (Ti).

The circuit wiring lines 140 formed in the bending area BA are subjected to a tensile force when being bent. The circuit wiring lines 140 extending in the same direction as the bending direction on the flexible substrate 111 are subjected to the largest tensile force. Therefore, a portion of the circuit wiring lines 140 disposed in the bending area BA may be formed to extend in a diagonal direction which is different from the bending direction.

Figure 4:
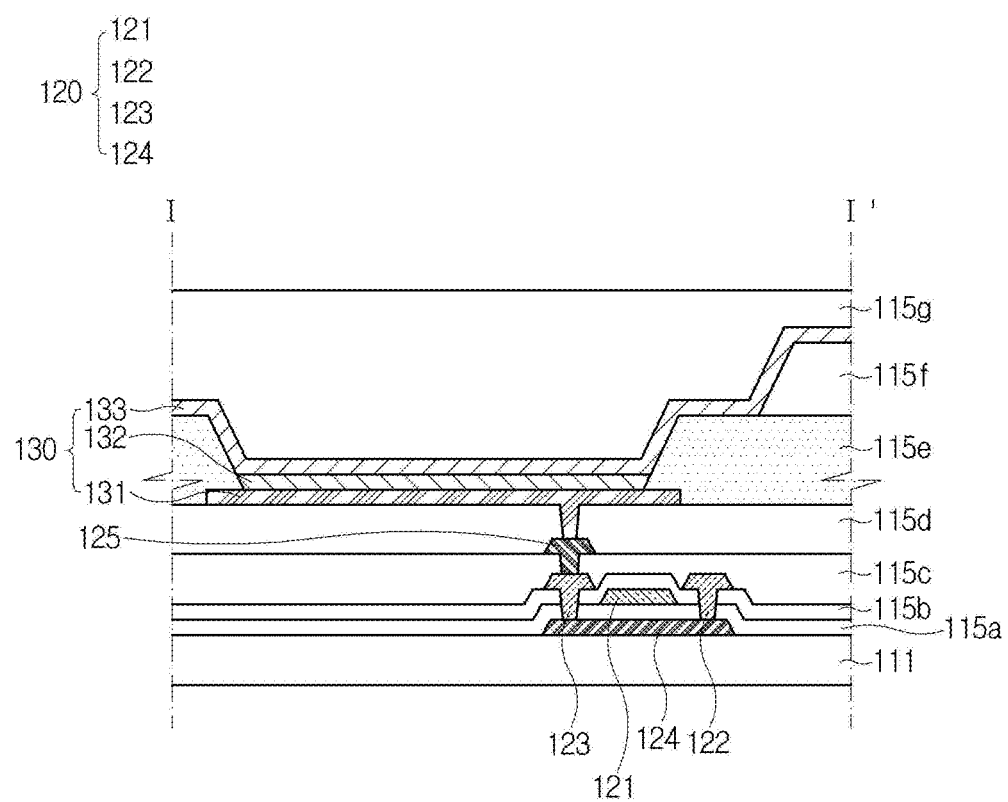
FIG. 4 is a cross-sectional view of a panel layer taken along line I-I' of FIG. 3.
Figure 5:
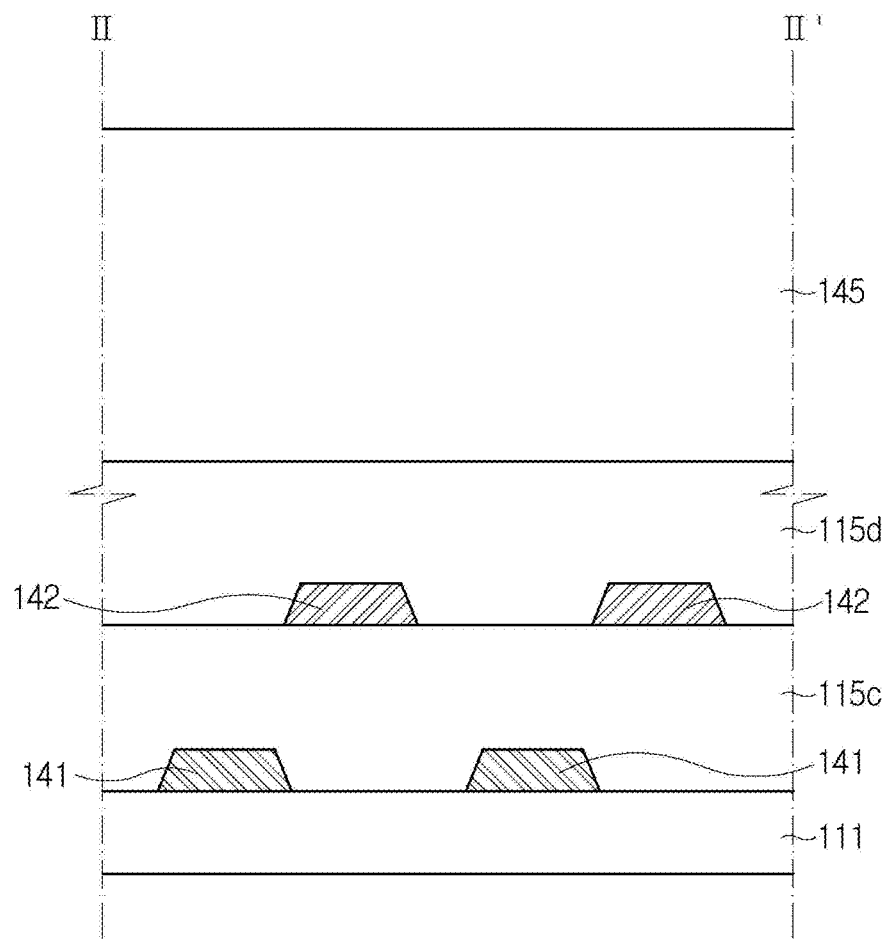
FIG. 5 is a cross-sectional view of the panel layer taken along line II-II' of FIG. 3.

FIG. 4 is a cross-sectional view of a panel layer taken along line I-I' of FIG. 3. FIG. 5 is a cross-sectional view of the panel layer taken along line II-II' of FIG. 3. With reference to FIGS. 4 and 5, the panel layer 110 will be described according to the present disclosure.

The flexible substrate 111 is a planar configuration disposed in a lower position, and serves to support and protect the components disposed thereon. The flexible substrate 111 may be formed of glass or plastic. For example, the flexible substrate 111 may be a type of film including one from a group consisting of a polyester-based polymer, a silicone-based polymer, an acrylic-based polymer, a polyolefin-based polymer, and a copolymer thereof.

A buffer layer (not shown) may be further disposed on the flexible substrate 111. The buffer layer may prevent penetration of moisture or other impurities from the outside through the flexible substrate 111, and may planarize a surface of the flexible substrate 111. The buffer layer is not necessarily an essential component, and may be omitted depending on a type of a thin film transistor 120 disposed on the flexible substrate 111.

The thin film transistor 120 may be disposed on the flexible substrate 111, and may include a gate electrode 121, a source electrode 122, a drain electrode 123 and a semiconductor layer 124. The semiconductor layer 124 may be formed of amorphous silicon or polycrystalline silicon. The semiconductor layer 124 may be formed of an oxide semiconductor. The semiconductor layer 124 may include a source region including a p-type or n-type impurity, a drain region, and a channel region between the source region and the drain region. Further, a low concentration doped region may be further included in the source region or the drain region that are adjacent to the channel region.

The source region and the drain region may be areas doped with a high concentration of impurity, and may be connected to the source electrode 122 and the drain electrode 123 of the thin film transistor 120, respectively. The channel region of the semiconductor layer 124 may be doped with the p-type impurity or the n-type impurity according to the NMOS or PMOS thin film transistor structure.

A first insulating layer 115a may be an insulating layer formed of a single layer or multi-layered structure of silicon oxide (SiOx) or silicon nitride (SiNx). The first insulating layer 115a may be disposed such that a current flowing in the semiconductor layer 124 does not flow to the gate electrode 121.

The gate electrode 121 may serve as a switch turning on or off the thin film transistor 120 based on an electric signal transmitted from the outside through the gate line. The source electrode 122 and the drain electrode 123 may be connected to the data line, and may allow the electrical signal transmitted from the outside to be transmitted from the thin film transistor 120 to the light emitting element 130.

A second insulating layer 115b may be formed on the first insulating layer 115a and the gate electrode 121. The second insulating layer 115b may be formed of a single layer or multi-layered structure of silicon oxide or silicon nitride in order to insulate the gate electrode 121, the source electrode 122, and the drain electrode 123 from each other.

Planarization layers 115c and 115d may be disposed on the second insulating layer 115b. The planarization layers 115c and 115d may be configured to protect the thin film transistor 120 and to planarize a step caused due to the thin film transistor 120. The planarization layers 115c and 115d may be formed of one or more materials of acrylic resin, epoxy resin, phenolic resin, polyamides resin, unsaturated polyesters resin, polyphenylene resin, polyphenylene sulfides resin, and benzocyclobutene.

An intermediate electrode 125 may be connected to the thin film transistor 120 through a contact hole formed in a first planarization layer 115c. The intermediate electrode 125 may electrically connect the drain electrode 123 of the thin film transistor 120 and an anode 131.

The light emitting element 130 may be disposed on a second planarization layer 115d. The light emitting element 130 may be include an anode 131, a light emitting unit 132, and a cathode 133.

The anode 131 may be disposed on the second planarization layer 115d, and may serve supply holes to the light emitting unit 132. The anode 131 may be in contact with the intermediate electrode 125 through a contact hole formed to pass through the second planarization layer 115d. The anode 131 may be formed of a transparent conductive material, such as indium tin oxide, indium zinc oxide, or the like.

A bank 115e may be disposed on the anode 131 and the second planarization layer 115d. The bank 115e may define may divide an area which actually emits light, thereby defining a sub-pixel. A spacer 115f may be disposed on the bank 115e to prevent a damage caused by a contact with a deposition mask.

The light emitting unit 132 may be disposed on the anode 131. The light emitting unit 132 may serve to emit light. The light emitting unit 132 may include an organic light emitting material that emits light by itself in response to an electrical signal. The light emitting unit 132 may include an organic light emitting material emitting a color for example, such as red, green, blue, white, or the like.

The cathode 133 may be disposed on the light emitting unit 132. The cathode 133 may serve to supply electrons to the light emitting unit 132. The cathode 133 may be formed of a metal material such as magnesium (Mg), a silver-magnesium alloy or the like. Also, the cathode 133 may be a transparent conductive oxide based on indium tin oxide, indium zinc oxide, indium tin zinc oxide, zinc oxide, or tin oxide.

An encapsulating unit 115g may be disposed on the cathode 133. The encapsulating unit 115g may serve to prevent the components in a lower position from being oxidized and damaged due to moisture, oxygen, or impurities from the outside. The encapsulating unit 115g may be formed by stacking a plurality of barrier films. The encapsulating unit 115g may be formed of an inorganic material of silicon nitride or aluminum oxide.

In describing FIG. 5, descriptions repeated with respect to the above descriptions will be omitted. With reference to FIG. 5, the display panel 100 according to the present disclosure may include double layers of wiring lines 141 and 142 in the non-display area NA including the bending area BA.

For example, a first wiring line 141 may be formed on the flexible substrate 111. The first planarization layer 115c may be formed on the first wiring line 141. A second wiring line 142 may be formed on the first planarization layer 115c. The second planarization layer 115d may be disposed on the second wiring line 142. A micro-coating layer 145 may be formed on the second planarization layer 115d.

The first wiring line 141 and the second wiring line 142 are the wiring lines to connect the panel layer 110 and a pad area PA. The first wiring line 141 and the second wiring line 142 may be formed of a conductive material having an excellent ductility such as gold, silver, or aluminum. Otherwise, the first wiring line 141 and the second wiring line 142 may be formed of molybdenum, chromium, titanium, nickel, neodymium, copper, or an alloy of silver and the like.

In the process of bending the flexible substrate 111, the bending area BA is subjected to great stress. The stress may cause cracks in a layer surrounding a wiring line. In addition, when a wiring line is formed in a single layer, it may require a large space the wiring line occupies. As disclosed in the present disclosure, by forming the wiring passing through the bending area BA in a multi-layered structure, stress generated in a layer surrounding the wiring line may be reduced and a space for the wiring line may be reduced.

Figure 6:
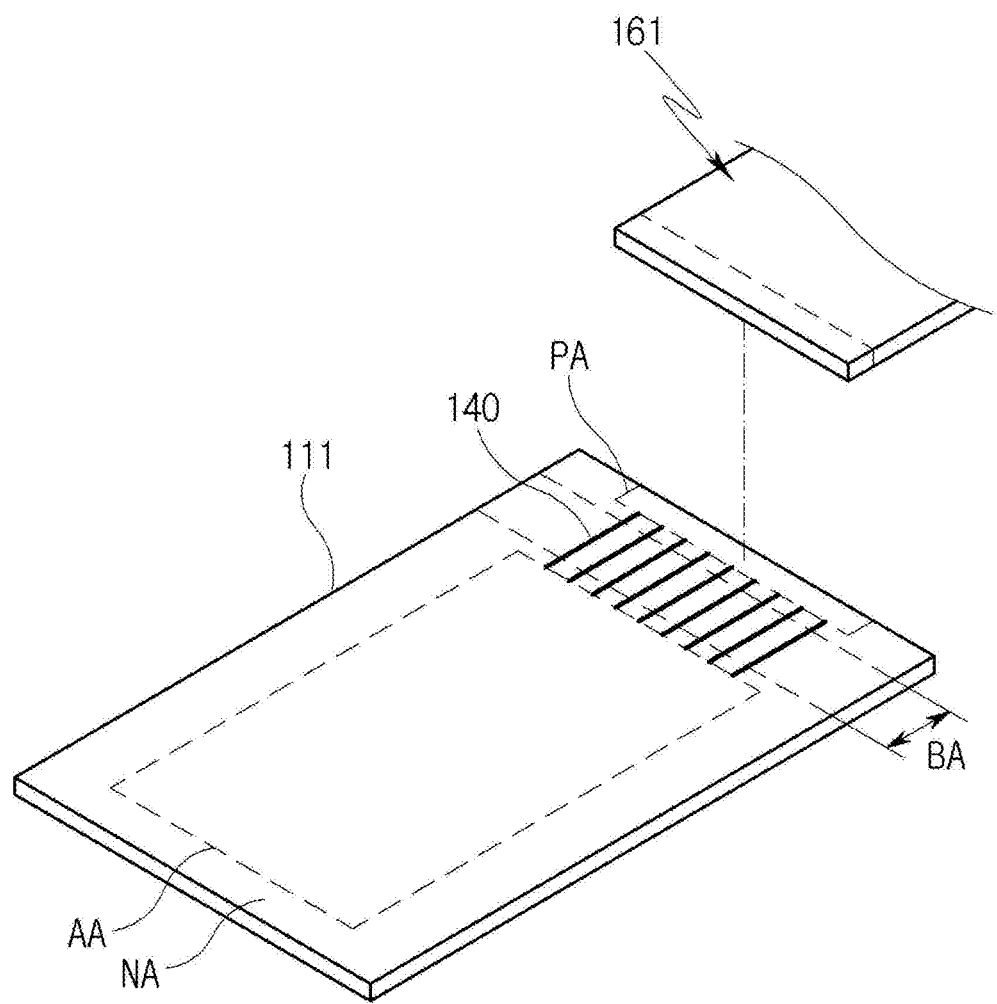
FIG. 6 is a perspective view of a flexible panel according to an embodiment of the present disclosure.
Figure 7:
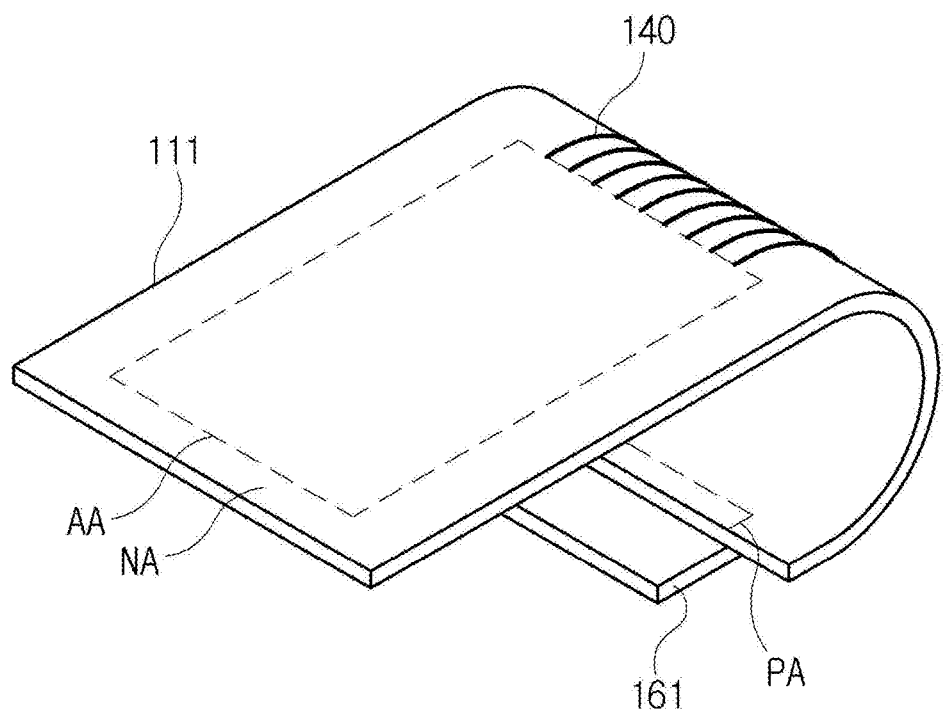
FIG. 7 is a perspective view illustrating a bent state of a flexible substrate according to an embodiment of the present disclosure.
Figure 8:
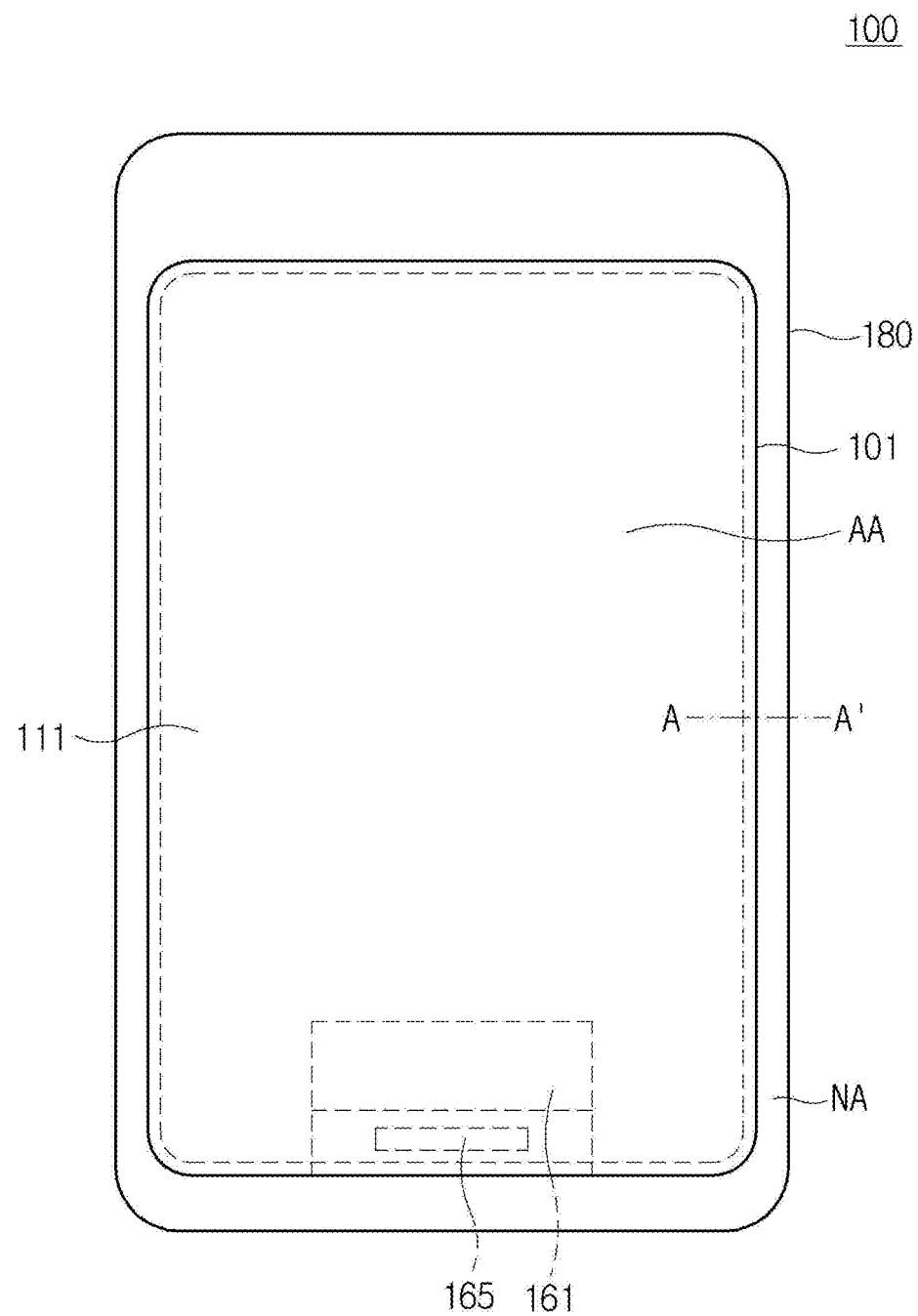
FIG. 8 is a plan view of illustrating a flexible panel bent according to an embodiment of the present disclosure.

FIG. 6 is a perspective view of a flexible panel according to an embodiment of the present disclosure. FIG. 7 is a perspective view illustrating a bent state of a flexible substrate according to an embodiment of the present disclosure. FIG. 8 is a plan view of illustrating a flexible panel bent according to an embodiment of the present disclosure. With reference to FIGS. 6 to 8, a flexible substrate will be described according to an embodiment of the present disclosure.

As illustrated in FIG. 6, the flexible substrate 111 may be divided into a display area AA and a non-display area NA which surrounding an edge of the display area AA. The non-display area NA may be divided to have a pad area PA where a pad is disposed. The display area AA is an area where a plurality of sub-pixels are disposed. The sub-pixels may be divided by gate lines and data lines that intersect each other.

A circuit element 161 may be configured to be connected to a pad in the pad area PA of the flexible substrate 111. The circuit element 161 may include a bump or a step. The bump of the circuit element 161 may be connected to the pads through an anisotropic conductive film. The circuit element 161 may be a chip on film (COF) in which a driver IC is mounted on a flexible film. Further, the circuit element 161 may be directly bonded to the pads on the substrate by a chip on glass (COG) process. Further, the circuit element 161 may be a flexible circuit such as a flexible printed circuit (FPC). The present disclose will describe the COF as an example of the circuit element 161.

As shown in FIG. 7, the flexible substrate 111 may be bent in a rear direction so that an edge in connect with the pad area PA has a predetermined curvature. As the substrate 111 is bent, the pad area PA may overlap the display area AA in the rear direction of the display area AA. The circuit element 161 or the driver IC 165 may not be visibly recognized from a front surface of the display panel 100. The flexible substrate 111 may be implemented of a flexible, bendable material, for bending. For example, the flexible substrate 111 may be formed of a plastic material such as polyimide.

As illustrated in FIG. 8, a cover window 180 may be coupled on one side of the bent flexible substrate 111. The cover window 180 is formed to have an area larger than the bent flexible substrate 111, so that the flexible substrate 111 may be accommodated therein.

In addition, a back plate 101 may be coupled on the other side of the bent flexible substrate 111. The back plate 101 may serve to maintain the rigidity of the display panel 100, to prevent foreign substances from being attached to the lower portion of the display panel 100, and to cushion an impact from the outside. The back plate 101 may be implemented of a plastic thin film formed of polyimide. It may be preferable that the back plate 101 is not formed in the bending portion BA.

Figure 9:
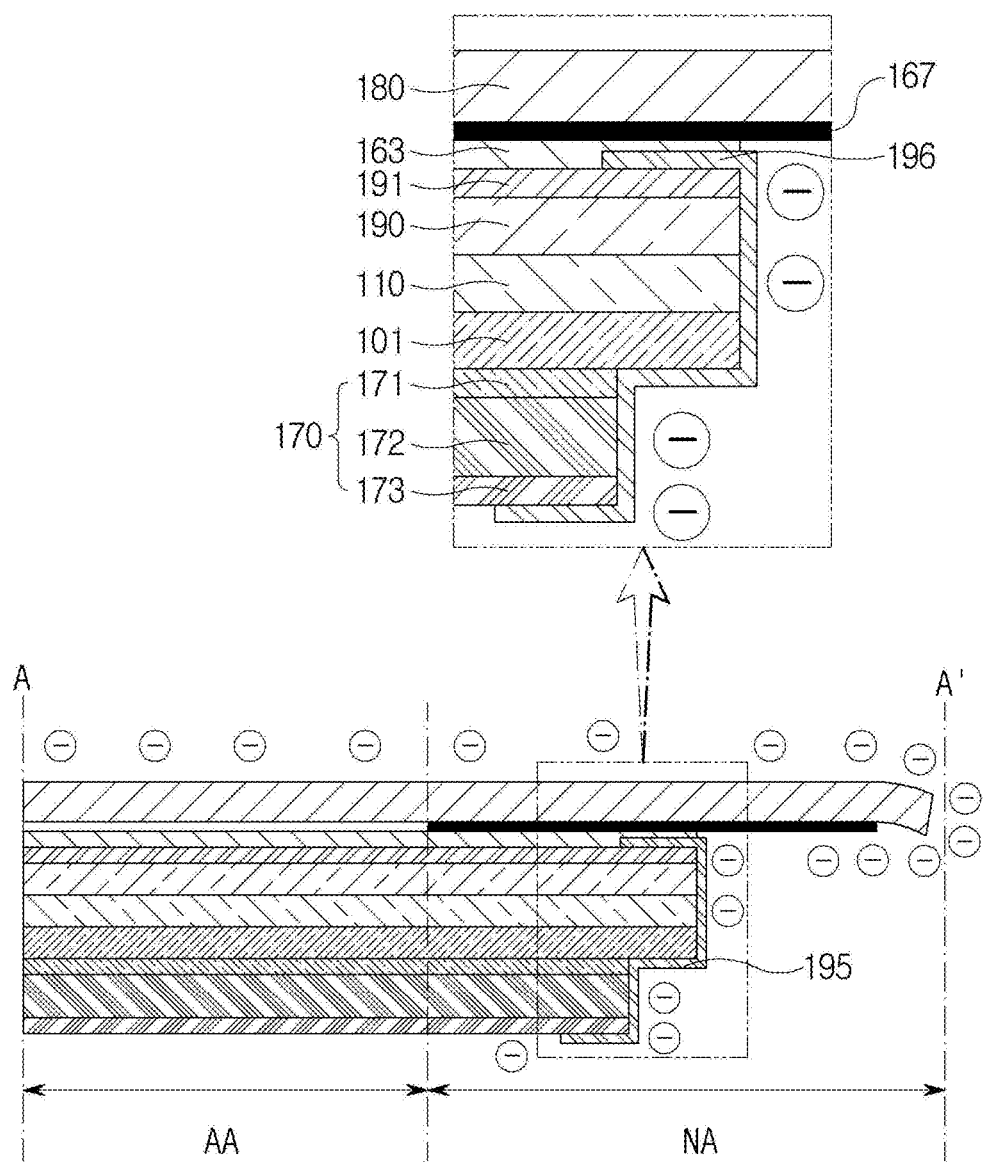
FIG. 9 is a cross-sectional view taken along direction A-A' of a display panel of FIG. 8 according to an embodiment of the present disclosure.

FIG. 9 is a cross-sectional view taken along direction A-A' of a display panel of FIG. 8 according to an embodiment of the present disclosure. With reference to FIG. 9, a display panel 100 will be described according to an embodiment of the present disclosure.

A display panel 100 may include a cover window 180 as an uppermost layer thereof, an adhesion layer 163 disposed below the cover window 180, a polarizing plate 190 disposed below the adhesion layer 163, and a panel layer 110 disposed below the polarizing plate 190. As described with reference to FIG. 4, the panel layer 110 may include a flexible substrate and may be bent in a bending area. FIG. 9 is a cross-sectional view taken along line A-A' of FIG. 8, and does not correspond to an area where the flexible substrate or the panel layer 110 is bent.

The cover window 180 may be disposed as an uppermost layer of the display panel 100 and may be of glass or plastic. The cover window 180 may serve as a protective layer to protect the elements inside the display panel 100 and be exposed to the outside. Accordingly, when a user of the display device performs touches or the like, it may come into contact with the user's finger(s), and an electric charge due to the friction may be generated. The electric charge generated by the friction or the like may move along a side surface of the cover window 180 and penetrate into the display panel 100.

The adhesion layer 163 may be disposed below the cover window 180 and serve to bond the cover window 180 and the polarizing plate 190 to each other. The adhesion layer 163 may be, for example, an optically clear adhesive (OCA) or a pressure sensitive adhesive (PSA), and may be a transparent material.

The polarizing plate 190 may be formed of a film having a polarizing function. The polarizing plate 190 may suppress reflection of the external light, thereby reducing reflection visibility when viewing from the outside. The polarizing plate 190 may be disposed on the display area AA.

According to the present embodiment, the polarizing plate 190 may be a polarizing plate 190 having been treated to have increased conductivity. For example, the polarizing plate 190 may include a conductive coating layer 191 disposed thereon. The conductive coating layer 191 may be configured of a material including a conductive ball or a conductive wire therein. Since a screen of the display panel needs to be visibly recognized from the front surface, the conductive coating layer 191 and the conductive ball or conductive wire therein may be formed of a transparent material. For example, the conductive coating layer 191 may include one or more of acrylic resin, epoxy resin, phenolic resin, polyamides resin, unsaturated polyesters resin, polyphenylene resin, polyphenylene sulfides resin and benzocyclobutene. The conductive ball may be a conductive ball having a conductive coating thereon by pre-processing of a ball formed of a polymer-based material to perform sputtering on the outer surface of the polymer ball. The conductive wire may be a silver nano (Ag nano) wire. The conductive wire may be divided into a conductive portion and an insulator portion, and may have conductivity through the conductive portion. The conductive ball or the conductive wire is one example of the conductive coating layer 191, and another type of the conductive coating layer 191 in which a film layer may have conductive properties may be used.

The polarizing plate 190 may have increased conductivity due to the conductive coating layer 191 formed in this way. For example, compared to a polarizing plate 190 not including the conductive coating layer 191, the polarizing plate 190 having the conductive coating layer 191 disposed thereon may have increased conductivity. Due to the increased conductivity of the polarizing plate 190, the electric charge penetrated into the display panel 100 may move to a heat dissipation sheet 173 through a side cover 195 which will be described later. As a result, the electric charge may not penetrate into the panel layer 110.

The panel layer 110 may be a layer in which a pixel is formed, and a transistor including a gate electrode, a source electrode, a drain electrode and a semiconductor layer is formed. Also, the panel layer 110 may be a layer having a light emitting diode such as an anode, a light emitting layer, a cathode, etc. When the frictional charge penetrates into the panel layer 110 as described above, a shift phenomenon may occur in the transistor, and thus the quality of the displayed image may deteriorate due to a greenish phenomenon.

The back plate 101 may be a rigid structure formed below the panel layer 110 and may serve to reinforce rigidity of the panel layer 110. The back plate 101 may be formed of a plastic thin film.

A support member 170 may be formed of a triple layer of an adhesive 171, a cushion tape 172, and a heat dissipation sheet 173. The adhesive 171 may be formed on a rear surface of the back plate 101. The adhesive 171 may include an embossing pattern. Such an embossing pattern may prevent occurrence of air bubbles. The cushion tape 172 may be compressed when receiving an external force to thereby absorb impacts. The cushion tape 172 may be formed on a rear surface of the adhesive 171. The heat dissipation sheet 173 may be disposed below the cushion tape 172. The heat dissipation sheet 173 may have a heat dissipation function. The heat dissipation sheet 173 may be, for example, formed of a metal material such as copper to dissipate heat generated by the driver IC 165 or the circuit element 161. In addition, the heat dissipation sheet 173 may serve as a ground for discharging the electric charge that has moved through a side cover 195 as a path, to the outside, as will be described later.

A black matrix 167 may be formed in a partial area of a lower portion of the cover window 180. The black matrix 167 may be formed along an edge of the display panel 100. The black matrix 167 may be formed of black ink. The black matrix 167 as described above may prevent the side cover 195 from being visibly recognized from the front surface of the display panel 100 by covering the side cover 195, as will be described later.

The side cover 195 may be attached at one end to a side surface of the polarizing plate, and may be attached at the other end to a lower surface of the support member 170. The side cover 195 may include a metal material. For example, the side cover 195 may be a film formed of silver (Ag).

The one end of the side cover 195 may be attached to a side surface of the conductive coating layer 191, a side surface of the polarizing plate 190, a side surface of the panel layer 110, and a side surface of the back plate 101. In addition, the side cover 195 may be disposed below the back plate 101 and may be attached to a side surface of the support member 170 including the adhesion layer 171, the cushion plate 172, and the heat dissipation sheet 173. The other end of the side cover 195 may be attached to a lower surface of the support member 170. That is, the other end of the side cover 195 may be attached to a lower surface of the heat dissipation sheet 173.

In other words, the side cover 195 may be in the form of a film that is attached at one end to the side surface of the polarizing plate 180 while extending in a vertical direction and is attached at the other end to the lower surface of the support member 170.

According to the present embodiment, the conductive coating layer 191 may be disposed on the polarizing plate 190, and the side cover 195 may extend along the side surface, so that a movement path of the frictional charge generated on the upper portion of the cover window 180 may be created. Here, the frictional charge travels downward along the side surface of the cover window 180, and entry of the electric charge into the panel layer 110 is blocked by the conductive coating layer 191 and the side cover 195. The electric charge continues to move downward along the side cover 195, which may be a metal material, and finally arrives at the heat dissipation sheet 173, which is the other end of the side cover 195. The electric charge arriving at the heat dissipation sheet 173 may be released by the heat dissipation sheet 173 that may be a metal material such as copper. As a result, the electric charge may not enter the panel layer 110, and thus the transistor disposed inside the panel layer 110 may not undergo the shift phenomenon, and the greenish phenomenon of the display panel 100 may be eliminated.

Also, according to the present embodiment, the side cover 195 may include a fixing portion 196. Specifically, the side cover 195 may be disposed on the conductive coating layer 191. Further, the side cover 195 may include the fixing portion 196 protruding inward from the adhesion layer 163. Here, the "inward" refers to a direction to the center of the display panel 100, and may be a direction to the cross-section A direction in FIG. 9. The fixing portion 196 may serve to fix the side cover 195. Specifically, the environment where the display panel 100 may be placed is under the situation of high-temperature and high-humidity or of low-temperature and low-humidity, or may be under other various situations. An element arranged inside the display panel 100 may contract or expand depending on an external environment. In addition, a coefficient of contraction or of expansion may vary according to materials constituting an element, and thus there may be a difference in the degree of contraction or expansion for each element. For example, there may be a difference in the degree of contraction or expansion between the polarizing plate 190 and the panel layer 110, with which the side cover 195 is in contact on its side surface. In this case, peeling-off of the side cover 195 on the side surface thereof may occur.

In the present embodiment, to solve the problem of such peeling-off, there is provided the fixing portion 196 protruding inward from an inside of the adhesion layer 163 that may be a flexible, bendable material. The fixing portion 196 is fixed due to the pressing force between the adhesion layer 163 and either the polarizing plate 190 or the conductive coating layer 191, so that the side cover 195 may remain as being attached to the side surface of the display panel 100 regardless of changes in the external environment.

Figure 10:
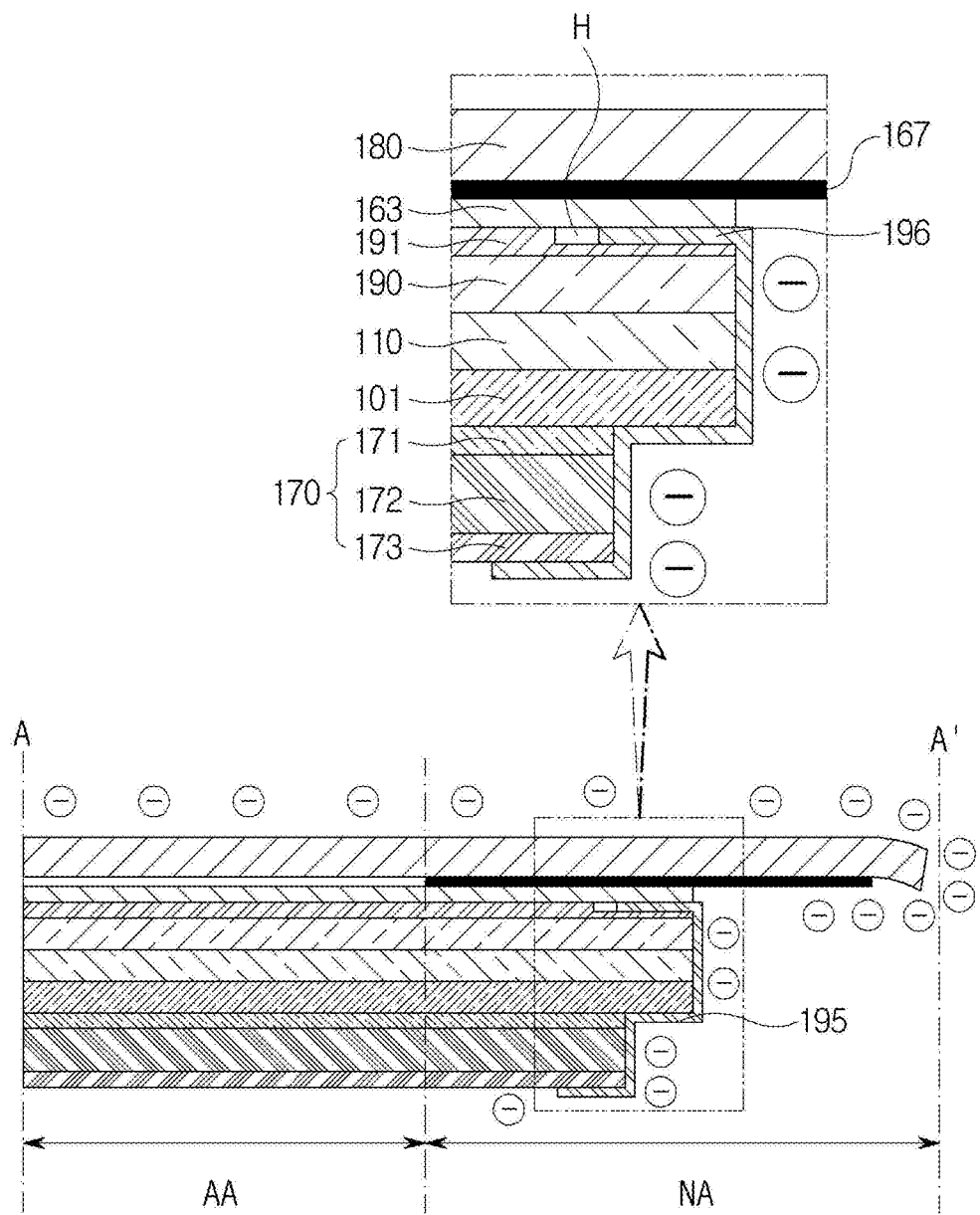
FIG. 10 is a cross-sectional view taken along direction A-A' of a display panel of FIG. 8 according to another embodiment of the present disclosure.

FIG. 10 is a cross-sectional view taken along direction A-A' of a display panel of FIG. 8 according to another embodiment of the present disclosure. With reference to FIG. 10, a display panel 100 will be described according to another embodiment of the present disclosure. Same reference numerals will be used to refer to the same or like components as those described in the above embodiments, and thus repetitive explanations for those will be omitted.

A display panel 100 may include a cover window 180 as an uppermost layer thereof, an adhesion layer 163 disposed below the cover window 180, a polarizing plate 190 disposed below the adhesion layer 163, and a panel layer 110 disposed below the polarizing plate 190. As described with reference to FIG. 4, the panel layer 110 may include a flexible substrate and may be bent in a bending area. FIG. 10 is a cross-sectional view taken along line A-A' of FIG. 8, and does not correspond to an area where the flexible substrate or the panel layer 110 is bent.

The cover window 180 may be disposed as an uppermost layer of the display panel 100 and may be of glass or plastic. An electric charge due to friction may be generated on an upper portion of the cover window 180. The electric charge generated by friction or the like may move along a side surface of the cover window 180 and penetrate into the display panel 100. As a result, a shift phenomenon may occur in the transistor inside the panel layer 110, and accordingly a greenish phenomenon may occur.

The adhesion layer 163 may be disposed below the cover window 180 and serve to bond the cover window 180 and the polarizing plate 190 to each other. The adhesion layer 163 may be, for example, an optically clear adhesive (OCA) or a pressure sensitive adhesive (PSA), and may be a transparent material.

The polarizing plate 190 may be formed of a film having a polarizing function. The polarizing plate 190 may suppress reflection of the external light, thereby reducing reflection visibility when viewing from the outside. The polarizing plate 190 may be disposed on the display area AA.

According to the present embodiment, the polarizing plate 190 may be a polarizing plate 190 having been treated to have increased conductivity. Specifically, the polarizing plate 190 may include a conductive coating layer 191 disposed thereon. For example, the conductive coating layer 191 may be configured of a material including a conductive ball or a conductive wire therein. The polarizing plate 190 may have increased conductivity due to the conductive coating layer 191 formed in this way. As compared to a polarizing plate 190 not including the conductive coating layer 191, the polarizing plate 190 having the conductive coating layer 191 disposed thereon may have increased conductivity.

Further, according to the present embodiment, the conductive coating layer 191 may include a stepped portion H. Specifically, the step portion H may have a form in which a portion of the conductive coating layer 191 is etched in a height direction. By inserting the protruding portion 196 to the stepped portion H, a force fixing a side cover 195 can be secured. This will be described below.

The panel layer 110 may be a layer in that a pixel is formed, and a transistor including a gate electrode, a source electrode, a drain electrode and a semiconductor layer is formed. Also, the panel layer 110 may be a layer having a light emitting diode such as an anode, a light emitting layer, a cathode, etc. When the frictional charge penetrates into the panel layer 110 as described above, a shift phenomenon may occur in the transistor, and thus the quality of the displayed image may deteriorate due to a greenish phenomenon.

The back plate 101 may be a rigid structure formed below the panel layer 110 and may serve to reinforce rigidity of the panel layer 110. The back plate 101 may be formed of a plastic thin film.

A support member 170 may be formed of a triple layer of an adhesive 171, a cushion tape 172, and a heat dissipation sheet 173. The adhesive 171 may be formed on a rear surface of the back plate 101. The cushion tape 172 may be compressed when receiving an external force to thereby absorb impacts. The cushion tape 172 may be formed on a rear surface of the adhesive 171. The heat dissipation sheet 173 may be disposed below the cushion tape 172. The heat dissipation sheet 173 may have a heat dissipation function. The heat dissipation sheet 173 may be formed of a metal material such as copper to dissipate heat. In addition, the heat dissipation sheet 173 may serve as a ground for discharging the electric charge that has moved through a side cover 195 as a path, to the outside.

A black matrix 167 may be formed in a partial area of a lower portion of the cover window 180. The black matrix 167 may prevent the side cover 195 from being visibly recognized from the front surface of the display panel 100 by covering the side cover 195.

The side cover 195 may be attached at one end to a side surface of the polarizing plate 190, and may be attached at the other end to a lower surface of the support member 170. The side cover 195 may include a metal material. For example, the side cover 195 may be a film formed of silver (Ag).

Specifically, the one end of the side cover 195 may be attached to a side surface of the conductive coating layer 191, a side surface of the polarizing plate 190, a side surface of the panel layer 110, and a side surface of the back plate 101. In addition, the side cover 195 may be disposed below the back plate 101 and may be attached to a side surface of the support member 170 including the adhesive layer 171, the cushion plate 172, and the heat dissipation sheet 173. The other end of the side cover 195 may be attached to a lower surface of the support member 170. For example, the other end of the side cover 195 may be attached to a lower surface of the heat dissipation sheet 173.

In other words, the side cover 195 may be in the form of a film that is attached at one end to the side surface of the polarizing plate 180 while extending in a vertical direction and is attached at the other end to the lower surface of the support member 170.

According to the present embodiment, the conductive coating layer 191 may be disposed on the polarizing plate 190, and the side cover 195 may extend along the side surface, so that a movement path of the frictional charge generated on the upper portion of the cover window 180 may be created. That is, the frictional charge travels downward along the side surface of the cover window 180, and entering of the electric charge into the panel layer 110 is blocked by the conductive coating layer 191 and the side cover 195. The electric charge continues to move downward along the side cover 195 which may be a metal material, and finally arrives at the heat dissipation sheet 173, which is the other end of the side cover 195. The electric charge arriving at the heat dissipation sheet 173 may be released by the heat dissipation sheet 173 that may be a metal material such as copper. As a result, the electric charge may not enter the panel layer 110, and thus the transistor disposed inside the panel layer 110 may not undergo the shift phenomenon, and the greenish phenomenon of the display panel 100 may be eliminated.

Also, according to the present embodiment, the side cover 195 may include a fixing portion 196. Specifically, the side cover 195 may be disposed on the conductive coating layer 191. Further, the conductive coating layer 191 may include in a partial area thereof a stepped portion H which is etched in a height direction. The side cover 195 may include a fixing portion 196 protruding inward from the stepped portion H. Here, the "inward" refers to a direction to the center of the display panel 100, and may be a direction to the cross-section A direction in FIG. 10. The fixing portion 196 may serve to fix the side cover 195. Specifically, the environment where the display panel 100 may be placed is under the situation of high-temperature and high-humidity or of low-temperature and low-humidity, or may be under other various situations. An element arranged inside the display panel 100 may contract or expand depending on an external environment. In addition, a coefficient of contraction or of expansion may vary according to materials constituting an element, and thus there may be a difference in the degree of contraction or expansion for each element. For example, there may be a difference in the degree of contraction or expansion between the polarizing plate 190 and the panel layer 110, with which the side cover 195 is in contact on its side surface. In this case, peeling-off of the side cover 195 on the side surface thereof may occur.

In the present embodiment, to solve the problem of such peeling-off, there is formed the stepped portion H by etching a portion of the conductive coating layer 191 in height, and there is provided the fixing portion 196 protruding inward from the stepped portion H. The fixing portion 196 is fixed due to the pressing force between the adhesion layer 163 and either the polarizing plate 190 or the conductive coating layer 191, so that the side cover 195 may remain as being attached to the side surface of the display panel 100 regardless of changes in the external environment.

Figure 11:
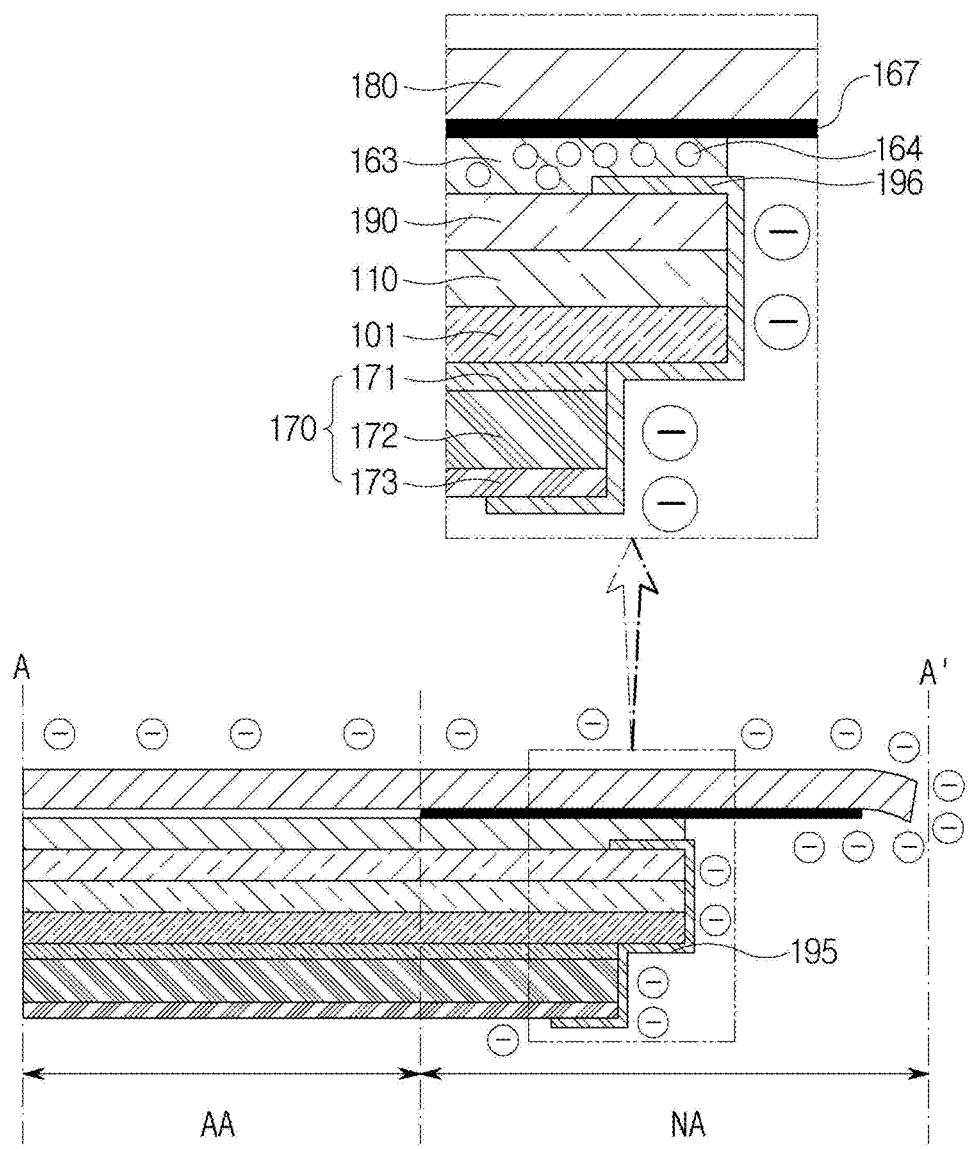
FIG. 11 is a cross-sectional view taken along direction A-A' of a display panel of FIG. 8 according to another embodiment of the present disclosure.

FIG. 11 is a cross-sectional view taken along direction A-A' of a display panel of FIG. 8 according to another embodiment of the present disclosure. With reference to FIG. 11, a display panel 100 will be described according to another embodiment of the present disclosure. In describing FIG. 11, the same reference numerals will be used to refer to the same or like components as those described in the above embodiments, and thus repetitive explanations for those will be omitted.

A display panel 100 may include a cover window 180 as an uppermost layer thereof, an adhesion layer 163 disposed below the cover window 180, a polarizing plate 190 disposed below the adhesion layer 163, and a panel layer 110 disposed below the polarizing plate 190. As described with reference to FIG. 4, the panel layer 110 may include a flexible substrate and may be bent in a bending area. FIG. 11 is a cross-sectional view taken along line A-A' of FIG. 8, and does not correspond to an area where the flexible substrate or the panel layer 110 is bent.

The cover window 180 may be disposed as an uppermost layer of the display panel 100 and may be of glass or plastic. An electric charge due to friction may be generated on an upper portion of the cover window 180. The electric charge generated by friction or the like may move along a side surface of the cover window 180 and penetrate into the display panel 100. As a result, a shift phenomenon may occur in the transistor inside the panel layer 110, and accordingly a greenish phenomenon may occur.

The adhesion layer 163 may be disposed below the cover window 180 and serve to bond the cover window 180 and the polarizing plate 190 to each other. The adhesion layer 163 may be, for example, an optically clear adhesive (OCA) or a pressure sensitive adhesive (PSA), and may be a transparent material.

According to the present embodiment, the adhesion layer 163 may be an adhesion layer 163 having been treated to have increased conductivity. Specifically, the adhesion layer 163 may include a conductive particle 164 therein. The conductive particle 164 may be a conductive ball or a conductive wire as described above. The adhesion layer 163 formed in this way may have increased conductivity. That is, compared to an adhesion layer 163 not including the conductive particle 164, the adhesion layer 163 according to the present embodiment may have higher conductivity. Due to the increased conductivity of the adhesion layer 163, the electric charge penetrated into the display panel 100 may move to a heat dissipation sheet 173 through a side cover 195 which will be described later. As a result, the electric charge may not penetrate into the panel layer 110.

The polarizing plate 190 may be formed of a film having a polarizing function. The polarizing plate 190 may suppress reflection of the external light, thereby reducing reflection visibility when viewing from the outside. The polarizing plate 190 may be disposed on the display area AA.

The panel layer 110 may be a layer in that a pixel is formed, and a transistor including a gate electrode, a source electrode, a drain electrode and a semiconductor layer is formed. Also, the panel layer 110 may be a layer having a light emitting diode such as an anode, a light emitting layer, a cathode, etc. When the frictional charge penetrates into the panel layer 110 as described above, a shift phenomenon may occur in the transistor, and thus the quality of the displayed image may deteriorate due to a greenish phenomenon.

The back plate 101 may be a rigid structure formed below the panel layer 110 and may serve to reinforce rigidity of the panel layer 110. The back plate 101 may be formed of a plastic thin film.

A support member 170 may be formed of a triple layer of an adhesive 171, a cushion tape 172, and a heat dissipation sheet 173. The adhesive 171 may be formed on a rear surface of the back plate 101. The cushion tape 172 may be compressed when receiving an external force to thereby absorb impacts. The cushion tape 172 may be formed on a rear surface of the adhesive 171. The heat dissipation sheet 173 may be disposed below the cushion tape 172. The heat dissipation sheet 173 may have a heat dissipation function. The heat dissipation sheet 173 may be formed of a metal material such as copper to dissipate heat. In addition, the heat dissipation sheet 173 may serve as a ground for discharging the electric charge that has moved through a side cover 195 as a path, to the outside.

A black matrix 167 may be formed in a partial area of a lower portion of the cover window 180. The black matrix 167 may prevent the side cover 195 from being visibly recognized from the front surface of the display panel 100 by covering the side cover 195.

The side cover 195 may be attached at one end to a side surface of the polarizing plate 190, and may be attached at the other end to a lower surface of the support member 170. The side cover 195 may include a metal material. For example, the side cover 195 may be a film formed of silver (Ag).

Specifically, the one end of the side cover 195 may be attached to a side surface of the polarizing plate 190, a side surface of the panel layer 110, and a side surface of the back plate 101. In addition, the side cover 195 may be disposed below the back plate 101 and may be attached to a side surface of the support member 170 including the adhesive layer 171, the cushion plate 172, and the heat dissipation sheet 173. The other end of the side cover 195 may be attached to a lower surface of the support member 170. That is, the other end of the side cover 195 may be attached to a lower surface of the heat dissipation sheet 173.

In other words, the side cover 195 may be in the form of a film that is attached at one end to the side surface of the polarizing plate 180 while extending in a vertical direction and is attached at the other end to the lower surface of the support member 170.

According to the present embodiment, the adhesion layer 163 may be treated to have increased conductivity by including the conductive particle 164 therein, and the side cover 195 may extend along the side surface, so that a movement path of the frictional charge generated on the upper portion of the cover window 180 may be created. That is, the frictional charge travels downward along the side surface of the cover window 180, and entering of the electric charge into the panel layer 110 is blocked by the adhesion layer 163 treated to have increased conductivity and the side cover 195. The electric charge continues to move downward along the side cover 195 which may be a metal material, and finally arrives at the heat dissipation sheet 173, which is the other end of the side cover 195. The electric charge arriving at the heat dissipation sheet 173 may be released by the heat dissipation sheet 173 that may be a metal material such as copper. As a result, the electric charge may not enter the panel layer 110, and thus the transistor disposed inside the panel layer 110 may not undergo the shift phenomenon, and the greenish phenomenon of the display panel 100 may be eliminated.

Also, according to the present embodiment, the side cover 195 may include a fixing portion 196. Specifically, the side cover 195 may be disposed on the polarizing plate 190. The side cover 195 may include the fixing portion 196 protruding inward from the adhesion layer 163. Here, the "inward" refers to a direction to the center of the display panel 100, and may be a direction to the cross-section A direction in FIG. 11. The fixing portion 196 may serve to fix the side cover 195. Specifically, the environment where the display panel 100 may be placed is under the situation of high-temperature and high-humidity or of low-temperature and low-humidity, or may be under other various situations. An element arranged inside the display panel 100 may contract or expand depending on an external environment. In addition, a coefficient of contraction or of expansion may vary according to materials constituting an element, and thus there may be a difference in the degree of contraction or expansion for each element. For example, there may be a difference in the degree of contraction or expansion between the polarizing plate 190 and the panel layer 110, with which the side cover 195 is in contact on its side surface. In this case, peeling-off of the side cover 195 on the side surface thereof may occur.

In the present embodiment, in order to solve the problem of such peeling-off, there is provided the fixing portion 196 protruding inward from an inside of the adhesion layer 163 that may be a flexible, bendable material. The fixing portion 196 is fixed due to the pressing force between the adhesion layer 163 and the polarizing plate 190, so that the side cover 195 may remain as being attached to the side surface of the display panel 100 regardless of changes in the external environment.

Figure 12:
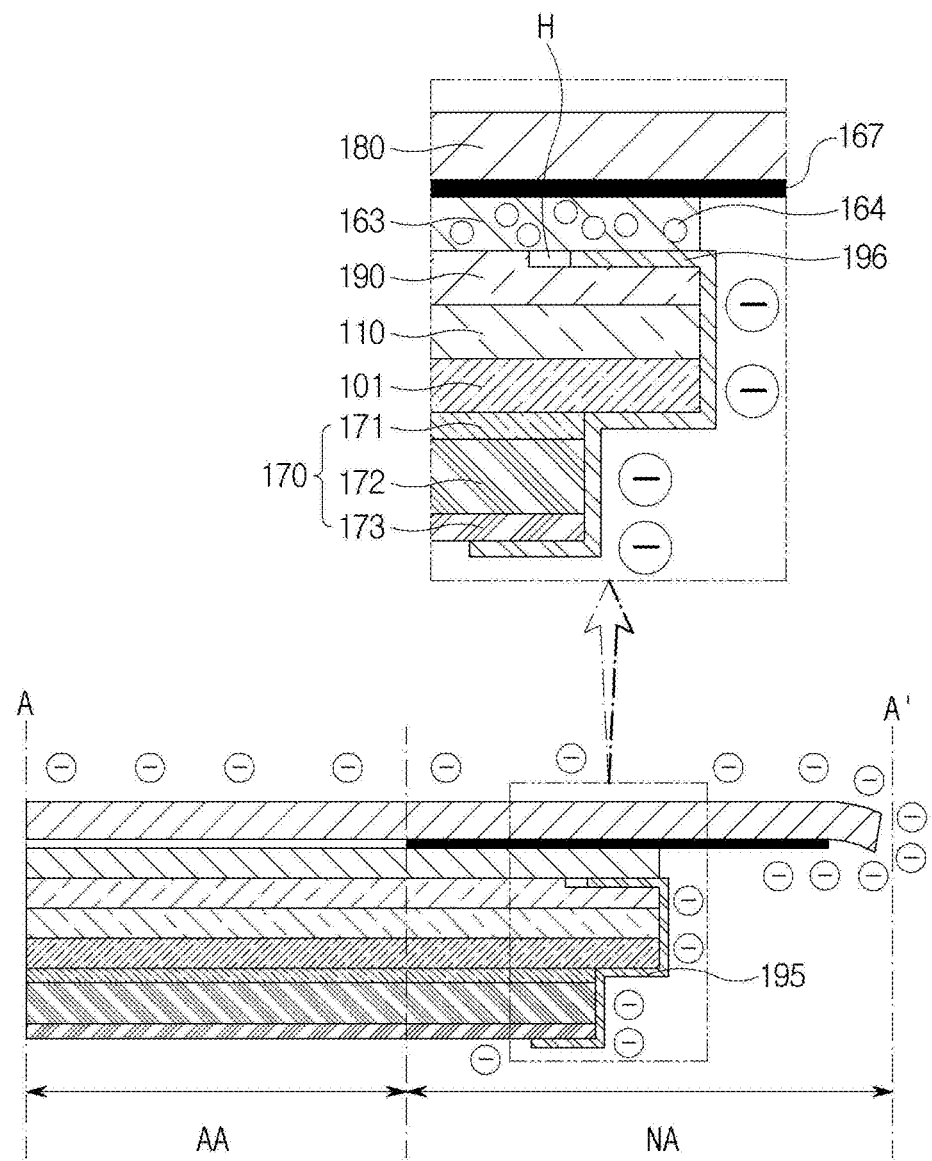
FIG. 12 is a cross-sectional view taken along direction A-A' of a display panel of FIG. 8 according to another embodiment of the present disclosure.

FIG. 12 is a cross-sectional view taken along direction A-A' of a display panel of FIG. 8 according to another embodiment of the present disclosure. With reference to FIG. 12, a display panel 100 will be described according to another embodiment of the present disclosure. In describing FIG. 12, the same reference numerals will be used to refer to the same or like components as those described in the above embodiments, and thus repetitive explanations for those will be omitted.

A display panel 100 may include a cover window 180 as an uppermost layer thereof, an adhesion layer 163 disposed below the cover window 180, a polarizing plate 190 disposed below the adhesion layer 163, and a panel layer 110 disposed below the polarizing plate 190. As described with reference to FIG. 4, the panel layer 110 may include a flexible substrate and may be bent in a bending area. FIG. 12 is a cross-sectional view taken along line A-A' of FIG. 8, and does not correspond to an area where the flexible substrate or the panel layer 110 is bent.

The cover window 180 may be disposed as an uppermost layer of the display panel 100 and may be of glass or plastic. An electric charge due to friction may be generated on an upper portion of the cover window 180. The electric charge generated by friction or the like may move along a side surface of the cover window 180 and penetrate into the display panel 100. As a result, a shift phenomenon may occur in the transistor inside the panel layer 110, and accordingly a greenish phenomenon may occur.

The adhesion layer 163 may be disposed below the cover window 180 and serve to bond the cover window 180 and the polarizing plate 190 to each other. The adhesion layer 163 may be, for example, an optically clear adhesive (OCA) or a pressure sensitive adhesive (PSA), and may be a transparent material.

According to the present embodiment, the adhesion layer 163 may be an adhesion layer 163 having been treated to have increased conductivity. Specifically, the adhesion layer 163 may include a conductive particle 164 therein. The conductive particle 164 may be a conductive ball or a conductive wire as described above. The adhesion layer 163 formed in this way may have increased conductivity. That is, compared to an adhesion layer 163 not including the conductive particle 164, the adhesion layer 163 according to the present embodiment may have higher conductivity. Due to the increased conductivity of the adhesion layer 163, the electric charge penetrated into the display panel 100 may move to a heat dissipation sheet 173 through a side cover 195 which will be described later. As a result, the electric charge may not penetrate into the panel layer 110.

The polarizing plate 190 may be formed of a film having a polarizing function. The polarizing plate 190 may suppress reflection of the external light, thereby reducing reflection visibility when viewing from the outside. The polarizing plate 190 may be disposed on the display area AA.

According to the present embodiment, the polarizing plate 190 may include a stepped portion H. Specifically, the step portion H may have a form in which a portion of the polarizing plate 190 is etched in a height direction. By inserting the protruding portion 196 into the stepped portion H, a force fixing the side cover 195 can be secured. This will be described below.

The panel layer 110 may be a layer in that a pixel is formed, and a transistor including a gate electrode, a source electrode, a drain electrode and a semiconductor layer is formed. Also, the panel layer 110 may be a layer having a light emitting diode such as an anode, a light emitting layer, a cathode, etc. When the frictional charge penetrates into the panel layer 110 as described above, a shift phenomenon may occur in the transistor, and thus the quality of the displayed image may deteriorate due to a greenish phenomenon.

The back plate 101 may be a rigid structure formed below the panel layer 110 and may serve to reinforce rigidity of the panel layer 110. The back plate 101 may be formed of a plastic thin film.

A support member 170 may be formed of a triple layer of an adhesive 171, a cushion tape 172, and a heat dissipation sheet 173. The adhesive 171 may be formed on a rear surface of the back plate 101. The cushion tape 172 may be compressed when receiving an external force to thereby absorb impacts. The cushion tape 172 may be formed on a rear surface of the adhesive 171. The heat dissipation sheet 173 may be disposed below the cushion tape 172. The heat dissipation sheet 173 may have a heat dissipation function. The heat dissipation sheet 173 may be formed of a metal material such as copper to dissipate heat. In addition, the heat dissipation sheet 173 may serve as a ground for discharging the electric charge that has moved through a side cover 195 as a path, to the outside.

A black matrix 167 may be formed in a partial area of a lower portion of the cover window 180. The black matrix 167 may prevent the side cover 195 from being visibly recognized from the front surface of the display panel 100 by covering the side cover 195.

The side cover 195 may be attached at one end to a side surface of the polarizing plate 190, and may be attached at the other end to a lower surface of the support member 170. The side cover 195 may include a metal material. For example, the side cover 195 may be a film formed of silver (Ag).

Specifically, the one end of the side cover 195 may be attached to a side surface of the polarizing plate 190, a side surface of the panel layer 110, and a side surface of the back plate 101. In addition, the side cover 195 may be disposed below the back plate 101 and may be attached to a side surface of the support member 170 including the adhesive layer 171, the cushion plate 172, and the heat dissipation sheet 173. The other end of the side cover 195 may be attached to a lower surface of the support member 170. That is, the other end of the side cover 195 may be attached to a lower surface of the heat dissipation sheet 173.

In other words, the side cover 195 may be in the form of a film that is attached at one end to the side surface of the polarizing plate 180 while extending in a vertical direction and is attached at the other end to the lower surface of the support member 170.

According to the present embodiment, the adhesion layer 163 may be treated to have increased conductivity by including the conductive particle 164 therein, and the side cover 195 may extend along the side surface, so that a movement path of the frictional charge generated on the upper portion of the cover window 180 may be created. That is, the frictional charge travels downward along the side surface of the cover window 180, and entering of the electric charge into the panel layer 110 is blocked by the adhesion layer 163 treated to have increased conductivity and the side cover 195. The electric charge continues to move downward along the side cover 195 which may be a metal material, and finally arrives at the heat dissipation sheet 173, which is the other end of the side cover 195. The electric charge arriving at the heat dissipation sheet 173 may be released by the heat dissipation sheet 173 that may be a metal material such as copper. As a result, the electric charge may not enter the panel layer 110, and thus the transistor disposed inside the panel layer 110 may not undergo the shift phenomenon, and the greenish phenomenon of the display panel 100 may be eliminated.

Also, according to the present embodiment, the side cover 195 may include the fixing portion 196 inserted into the stepped portion H formed on the polarizing plate 190. Specifically, the side cover 195 may include the fixing portion 196 protruding inward from the adhesion layer 163. Here, the "inward" refers to a direction to the center of the display panel 100, and may be a direction to the cross-section A direction in FIG. 12. The fixing portion 196 may serve to fix the side cover 195 by being inserted into the stepped portion H. Specifically, the environment where the display panel 100 may be placed is under the situation of high-temperature and high-humidity or of low-temperature and low-humidity, or may be under other various situations. An element arranged inside the display panel 100 may contract or expand depending on an external environment. In addition, a coefficient of contraction or of expansion may vary according to materials constituting an element, and thus there may be a difference in the degree of contraction or expansion for each element. For example, there may be a difference in the degree of contraction or expansion between the polarizing plate 190 and the panel layer 110, with which the side cover 195 is in contact on its side surface. In this case, peeling-off of the side cover 195 on the side surface thereof may occur.

In the present embodiment, to solve the problem of such peeling-off, there is formed the stepped portion H by etching a portion of the polarizing plate 190 in height, and there is provided the fixing portion 196 inserted into the stepped portion H. The fixing portion 196 is fixed due to the pressing force between the adhesion layer 163 and the polarizing plate 190, so that the side cover 195 may remain as being attached to the side surface of the display panel 100 regardless of changes in the external environment.

Figure 13:
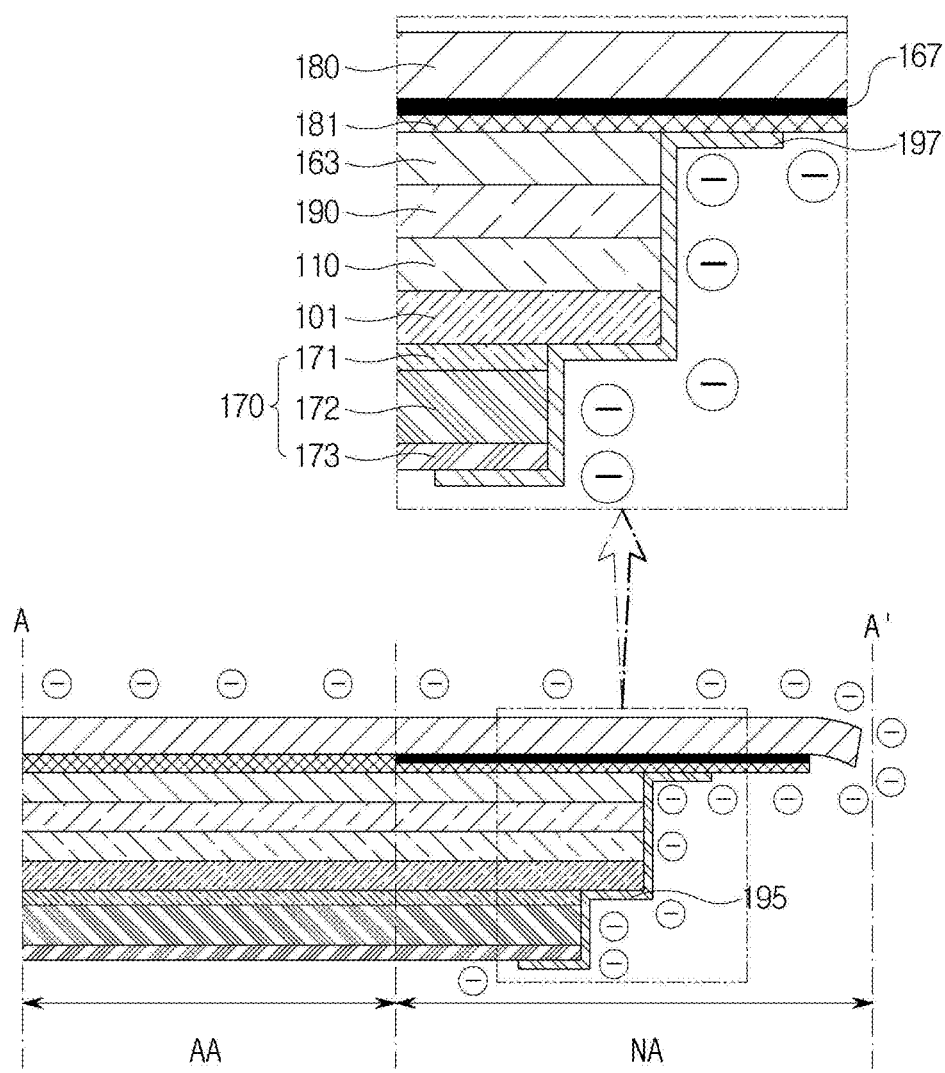
FIG. 13 is a cross-sectional view taken along direction A-A' of a display panel of FIG. 8 according to another embodiment of the present disclosure.

FIG. 13 is a cross-sectional view taken along direction A-A' of a display panel of FIG. 8 according to another embodiment of the present disclosure. With reference to FIG. 13, a display panel 100 will be described according to another embodiment of the present disclosure. In describing FIG. 13, the same reference numerals will be used to refer to the same or like components as those described in the above embodiments, and thus repetitive explanations for those will be omitted.

A display panel 100 may include a cover window 180 as an uppermost layer thereof, an adhesion layer 163 disposed below the cover window 180, a polarizing plate 190 disposed below the adhesion layer 163, and a panel layer 110 disposed below the polarizing plate 190. As described with reference to FIG. 4, the panel layer 110 may include a flexible substrate and may be bent in a bending area. FIG. 13 is a cross-sectional view taken along line A-A' of FIG. 8, and does not correspond to an area where the flexible substrate or the panel layer 110 is bent.

The cover window 180 may be disposed as an uppermost layer of the display panel 100 and may be of glass or plastic. An electric charge due to friction may be generated on an upper portion of the cover window 180. The electric charge generated by friction or the like may move along a side surface of the cover window 180 and penetrate into the display panel 100. As a result, a shift phenomenon may occur in the transistor inside the panel layer 110, and accordingly a greenish phenomenon may occur.

In the present embodiment, the cover window 180 may include a conductive coating layer 181 disposed therebelow. Specifically, the conductive coating layer 181 may be configured of a material including a conductive ball or a conductive wire therein. The cover window 180 formed in this way may have increased conductivity due to the conductive coating layer 181. That is, compared to a cover window 180 not including the conductive coating layer 181, the cover window 180 according to the present embodiment may have higher conductivity. Due to the cover window 180 having the increased conductivity, the electric charge penetrated into the display panel 100 may move to a heat dissipation sheet 173 through a side cover 195 which will be described later. As a result, the electric charge may not enter the panel layer 110.

The adhesion layer 163 may be disposed below the cover window 180 and serve to bond the cover window 180 and the polarizing plate 190 to each other. The adhesion layer 163 may be, for example, an optically clear adhesive (OCA) or a pressure sensitive adhesive (PSA), and may be a transparent material.

The polarizing plate 190 may be formed of a film having a polarizing function. The polarizing plate 190 may suppress reflection of the external light, thereby reducing reflection visibility when viewing from the outside. The polarizing plate 190 may be disposed on the display area AA.

The panel layer 110 may be a layer in that a pixel is formed, and a transistor including a gate electrode, a source electrode, a drain electrode and a semiconductor layer is formed. Also, the panel layer 110 may be a layer having a light emitting diode such as an anode, a light emitting layer, a cathode, etc. When the frictional charge penetrates into the panel layer 110 as described above, a shift phenomenon may occur in the transistor, and thus the quality of the displayed image may deteriorate due to a greenish phenomenon.

The back plate 101 may be a rigid structure formed below the panel layer 110 and may serve to reinforce rigidity of the panel layer 110. The back plate 101 may be formed of a plastic thin film.

A support member 170 may be formed of a triple layer of an adhesive 171, a cushion tape 172, and a heat dissipation sheet 173. The adhesive 171 may be formed on a rear surface of the back plate 101. The cushion tape 172 may be compressed when receiving an external force to thereby absorb impacts. The cushion tape 172 may be formed on a rear surface of the adhesive 171. The heat dissipation sheet 173 may be disposed below the cushion tape 172. The heat dissipation sheet 173 may have a heat dissipation function. The heat dissipation sheet 173 may be formed of a metal material such as copper to dissipate heat. In addition, the heat dissipation sheet 173 may serve as a ground for discharging the electric charge that has moved through a side cover 195 as a path, to the outside.

A black matrix 167 may be formed in a partial area of a lower portion of the cover window 180. The black matrix 167 may prevent the side cover 195 from being visibly recognized from the front surface of the display panel 100 by covering the side cover 195.

The side cover 195 may be attached at one end to a side surface of the polarizing plate 190, and may be attached at the other end to a lower surface of the support member 170. Also, the side cover 195 may include an extending portion 197, and the extending portion 197 may be disposed below the conductive coating layer 181 protruding outward and may be disposed on the side surface of the adhesion layer 163. Here, the "outward" refers to a direction being away from the center of the display panel 100, and may be a direction to the cross-section A' direction in FIG. 13. The side cover 195 may include a metal material. For example, the side cover 195 may be a film formed of silver (Ag).

According to this structure, the side cover 195 may be a film forming a path starting from an outside of the conductive coating layer 181, extending inward and downward, to a lower surface of the heat dissipation sheet 173 of the support member 170.

According to the present embodiment, the cover window 180 may include the conductive coating layer 181 disposed therebelow, and the side cover 195 may extend along the side surface, so that a movement path of the frictional charge generated on the upper portion of the cover window 180 may be created. That is, the frictional charge travels downward along the side surface of the cover window 180, and entering of the electric charge into the panel layer 110 is blocked by the cover window 180 treated to have increased conductivity and the side cover 195. The electric charge continues to move downward along the side cover 195 which may be a metal material, and finally arrives at the heat dissipation sheet 173, which is the other end of the side cover 195. The electric charge arriving at the heat dissipation sheet 173 may be released by the heat dissipation sheet 173 that may be a metal material such as copper. As a result, the electric charge may not enter the panel layer 110, and thus the transistor disposed inside the panel layer 110 may not undergo the shift phenomenon, and the greenish phenomenon of the display panel 100 may be eliminated.

On the other hand, by the extending portion 197 according to the present embodiment having a shape protruding outward, moving of the electric charge into the display layer 110 may be blocked. Under the assumption that the extending portion 197 has a shape protruding inward, since the conductive coating layer 181 is formed over the entire surface of the cover window 180, the electric charge may move horizontally along the conductive coating layer 181 and eventually create a path into the panel layer 110. Contrary thereto, since the extending portion 197 according to the present embodiment protrudes outward, the electric charge may be prevented in advance from entering into the display panel 100.

The exemplary embodiments of the present disclose can also be described as follows:

According to an aspect of the present disclosure, a display panel may comprise a cover window; an adhesion layer below the cover window; a polarizing plate below the adhesion layer; a panel layer below the polarizing plate; a support member below the panel layer; and a conductive side cover attached to a side surface of the polarizing plate and to a lower surface of the support member, wherein at least one of the cover window, the adhesion layer, and the polarizing plate includes an electrically conductive material to have increased electrical conductivity.

An electrical path may be defined such that the cover window is electrically connected to the support member through the side cover and the at least one of the cover window, the adhesion layer and the polarizing plate.

The side cover may include a metal.

The metal may include silver (Ag).

The side cover may be covered by a black matrix.

The polarizing plate may include a conductive coating layer disposed thereon.

The side cover may include a fixing portion on the conductive coating layer and protruding inward from the adhesion layer.

The conductive coating layer may include a stepped portion, and the side cover may include a fixing portion protruding inward from the stepped portion.

The adhesion layer may include a conductive particle therein.

The side cover may include a fixing portion on the polarizing plate and protruding inward from the adhesion layer.

The polarizing plate may include a stepped portion, and the side cover may include a fixing portion protruding inward from the stepped portion.

The cover window may include a conductive coating layer disposed therebelow.

The side cover may include an extending portion below the conductive coating layer and protruding outward, and the extending portion may be on a side surface of the adhesion layer.

The display panel may further comprise a back plate disposed between the panel layer and the support member.

The support member may include an adhesive, a cushion tape, and a heat dissipation sheet sequentially disposed below the panel layer.

The ends of the polarizing plate and the panel layer may extend further in a horizontal direction than an end of the support member.

The conductive side cover may include a bent shape to abut the ends of the polarizing plate and the end of the support member.

A first end of the conductive side cover may extend in the horizontal direction to be disposed between the cover window and the polarizing plate.

A second end of the conductive side cover may extend in the horizontal direction along the lower surface of the support member.

A first end of the conductive side cover may extend in the horizontal direction to be protruding away from the polarizing plate and to be disposed below the cover window.

The support member may include an adhesive, a cushion tape, and a heat dissipation sheet sequentially below the panel layer, and a second end of the conductive side cover may extend in the horizontal direction along the lower surface of the heat dissipation sheet of the support member.

It will be apparent to those skilled in the art that various modifications and variations can be made in the display panel of the present disclosure without departing from the technical idea or scope of the disclosure. Thus, it is intended that the present disclosure cover the modifications and variations of this disclosure provided they come within the scope of the appended claims and their equivalents.

What is claimed is:

1. A display panel, comprising:
    a cover window;
    an adhesion layer below the cover window;
    a polarizing plate below the adhesion layer;
    a panel layer below the polarizing plate;
    a support member below the panel layer; and
    a conductive side cover attached to a side surface of the polarizing plate and to a lower surface of the support member, the conductive side cover including a fixing portion protruding in a direction inward from the side surface such that the fixing portion is disposed under and in direct contact with a portion of the adhesion layer,
    wherein at least one of the cover window, the adhesion layer, and the polarizing plate includes an electrically conductive material to have increased electrical conductivity.

2. The display panel of claim 1, wherein an electrical path is defined such that the cover window is electrically connected to the support member through the conductive side cover and the at least one of the cover window, the adhesion layer and the polarizing plate.

3. The display panel of claim 2, wherein the conductive side cover includes a metal.

4. The display panel of claim 3, wherein the metal includes silver (Ag).

5. The display panel of claim 1, wherein the conductive side cover is covered by a black matrix.

6. The display panel of claim 1, wherein the polarizing plate includes a conductive coating layer disposed thereon.

7. The display panel of claim 6, wherein the fixing portion is on the conductive coating layer.

8. The display panel of claim 6, wherein the conductive coating layer includes a stepped portion, and
    wherein the fixing portion is in direct contact with the stepped portion.

9. The display panel of claim 1, wherein the adhesion layer includes a conductive particle therein.

10. The display panel of claim 9, wherein the fixing portion is in direct contact with an upper surface of the polarizing plate.

11. The display panel of claim 9, wherein the polarizing plate includes a stepped portion, and wherein the fixing portion is in direct contact with the stepped portion.

12. The display panel of claim 1, wherein the cover window includes a conductive coating layer disposed therebelow.

13. The display panel of claim 12, wherein the conductive side cover includes an extending portion below the conductive coating layer and protruding outward, and wherein the extending portion is on a side surface of the adhesion layer.

14. The display panel of claim 1, further comprising a back plate disposed between the panel layer and the support member.

15. The display panel of claim 1, wherein the support member includes an adhesive, a cushion tape, and a heat dissipation sheet sequentially disposed below the panel layer.

16. The display panel of claim 1, wherein the ends of the polarizing plate and the panel layer extend further in a horizontal direction than an end of the support member.

17. The display panel of claim 16, wherein the conductive side cover includes a bent shape to abut the ends of the polarizing plate and the end of the support member.

18. The display panel of claim 17, wherein a first end of the conductive side cover extends in the horizontal direction to be disposed between the cover window and the polarizing plate.

19. The display panel of claim 17, wherein a second end of the conductive side cover extends in the horizontal direction along the lower surface of the support member.

20. The display panel of claim 17, wherein a first end of the conductive side cover extends in the horizontal direction to be protruding away from the polarizing plate and to be disposed below the cover window.

21. The display panel of claim 1, wherein the support member includes an adhesive, a cushion tape, and a heat dissipation sheet sequentially below the panel layer, and
wherein a second end of the conductive side cover extends in the horizontal direction along the lower surface of the heat dissipation sheet of the support member.

22. A display panel, comprising:
a cover window;
an adhesion layer below the cover window;
a polarizing plate below the adhesion layer;
a panel layer below the polarizing plate;
a support member below the panel layer; and
a conductive side cover attached to a side surface of the polarizing plate and to a lower surface of the support member,
wherein the polarizing plate includes a conductive coating layer disposed thereon, and
wherein at least one of the cover window, the adhesion layer, and the polarizing plate includes an electrically conductive material to have increased electrical conductivity.

23. A display panel, comprising:
a cover window;
an adhesion layer below the cover window;
a polarizing plate below the adhesion layer;
a panel layer below the polarizing plate;
a support member below the panel layer; and
a conductive side cover attached to a side surface of the polarizing plate and to a lower surface of the support member,
wherein at least one of the cover window, the adhesion layer, and the polarizing plate includes an electrically conductive material to have increased electrical conductivity
wherein the adhesion layer includes a conductive particle therein,
wherein the polarizing plate includes a stepped portion, and
wherein the conductive side cover includes a fixing portion protruding inward to be in direct contact with the adhesion layer and the stepped portion of the polarizing plate.

24. A display panel, comprising:
a cover window;
an adhesion layer below the cover window;
a polarizing plate below the adhesion layer;
a panel layer below the polarizing plate;
a support member below the panel layer; and
a conductive side cover attached to a side surface of the polarizing plate and to a lower surface of the support member,
wherein the support member includes an adhesive, a cushion tape, and a heat dissipation sheet sequentially disposed below the panel layer, and
wherein at least one of the cover window, the adhesion layer, and the polarizing plate includes an electrically conductive material to have increased electrical conductivity.

* * * * *